(12) United States Patent
Nakamura

(10) Patent No.: US 7,229,882 B2
(45) Date of Patent: Jun. 12, 2007

(54) METHOD OF MANUFACTURING A FIELD EFFECT SEMICONDUCTOR DEVICE HAVING A STACKED GATE INSULATION FILM AND A GATE ELECTRODE

(75) Inventor: Katsumi Nakamura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 83 days.

(21) Appl. No.: 11/004,838

(22) Filed: Dec. 7, 2004

(65) Prior Publication Data

US 2005/0151188 A1 Jul. 14, 2005

Related U.S. Application Data

(62) Division of application No. 09/521,460, filed on Mar. 8, 2000, now Pat. No. 6,847,079.

(30) Foreign Application Priority Data

Sep. 13, 1999 (JP) .................................. 11-259163

(51) Int. Cl.
*H01L 21/336* (2006.01)
(52) U.S. Cl. ................... 438/259; 438/270; 257/330
(58) Field of Classification Search ................ 438/259, 438/270; 257/329, 330, 332
See application file for complete search history.

(56) References Cited

U.S. PATENT DOCUMENTS 5,319,230 A * 6/1994 Nakao .......................... 257/325
5,321,289 A * 6/1994 Baba et al. ................. 257/331
5,783,491 A 7/1998 Nakamura et al.
5,981,404 A * 11/1999 Sheng et al. ................ 438/791

(Continued)

FOREIGN PATENT DOCUMENTS

JP 4-324632 11/1992

(Continued)

OTHER PUBLICATIONS

"High Reliable UMOSFET with Oxide-Nitride Complex Gate Structure", by Y. Baba et al., 1997 IEEE, pp. 369-373.

*Primary Examiner*—Phat X. Cao
(74) *Attorney, Agent, or Firm*—McDermott Will & Emery LLP

(57) ABSTRACT

A semiconductor device of the present invention includes an MOSFET which has a stacked gate insulation film formed of at least two types of insulation films, that is, a thermal oxide film provided on a semiconductor substrate and a CVD oxide film provided nearer to a gate electrode than thermal oxide film. The stacked insulation film is provided so that the ratio of the thickness of the CVD oxide film to that of the entire stacked gate insulation film is at least 20%. By such a structure, the gate insulation film thickness is kept uniform. Further, nitrogen may be segregated at an interface between the thermal oxide film and a semiconductor substrate and an interface between the gate electrode and the CVD oxide film. Thus, the occurrence of interface states is prevented between the gate insulation film and the semiconductor substrate as well as between the gate insulation film and the gate electrode. As a result, a semiconductor device with improved gate insulation film and transistor characteristics of an MOSFET as well as a manufacturing method thereof are obtained.

9 Claims, 26 Drawing Sheets

U.S. PATENT DOCUMENTS

| | | |
|---|---|---|
| 6,027,961 A | 2/2000 | Maiti et al. |
| 6,124,153 A | 9/2000 | Lee et al. |
| 6,168,996 B1 * | 1/2001 | Numazawa et al. ........ 438/270 |
| 6,177,311 B1 * | 1/2001 | Kauffman et al. .......... 438/257 |
| 6,187,633 B1 * | 2/2001 | Dong et al. ................. 438/261 |

FOREIGN PATENT DOCUMENTS

| | | |
|---|---|---|
| JP | 6-61470 | 3/1994 |
| JP | 7-245400 | 9/1995 |
| JP | 7-249770 | 9/1995 |
| JP | 07249770 | 9/1995 |
| JP | 7-263692 | 10/1995 |
| JP | 8-172091 | 7/1996 |
| JP | 10-326777 | 12/1998 |
| JP | 11074514 | 3/1999 |
| JP | 11-74514 | 9/1999 |

\* cited by examiner

FIG.16
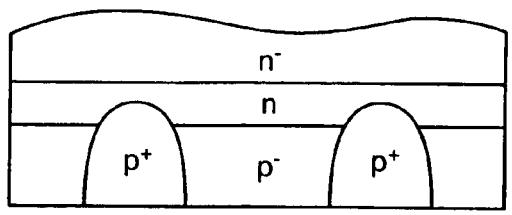
FIG.17
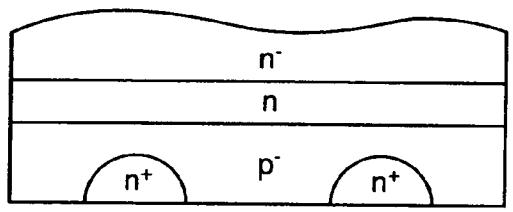
FIG.18
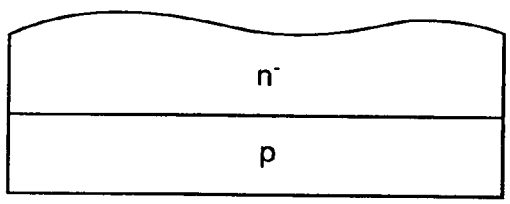
FIG.19
| Sample | GATE INSULATION FILM CONDITIONS |
|---|---|
| A | THERMAL OXIDE FILM |
| B | CVD OXIDE FILM / THERMAL OXIDE FILM |
| C | CVD OXIDE FILM / THERMAL OXIDE FILM (OXYNITRIDE FILM) |
| D | CVD OXIDE FILM (OR OXIDE FILM WHICH IS FORMED BY RE-OXIDATING $Si_3N_4$ SURFACE) / $Si_3N_4$ / THERMAL OXIDE FILM |
| E | ONLY CVD OXIDE FILM |

METHOD OF MANUFACTURING A FIELD EFFECT SEMICONDUCTOR DEVICE HAVING A STACKED GATE INSULATION FILM AND A GATE ELECTRODE

This application is a divisional of application Ser. No. 09/521,460 filed Mar. 8, 2000 now U.S. Pat. No. 6,847,079.

BACKGROUND OF THE INVENTION

1. Field of the Invention

The present invention relates to semiconductor devices including an MOS (Metal Oxide Semiconductor) type FET (Field Effect Transistor) and manufacturing methods thereof. More particularly, the present invention relates to a semiconductor device including a power transistor structure (i.e.: IGBT (Insulated Gate Bipolar Transistor), MOSFET etc.) and a manufacturing method thereof.

2. Description of the Background Art

Bipolar type MOSFETs with an MOS structure formed in a trench, that is, IGBTs which have a power transistor structure are conventionally used. In the following, a conventional IGBT structure will be described with reference to FIG. 41.

As shown in FIG. 41, the conventional IGBT has impurity layers formed in a semiconductor substrate 200 as described below. A p$^+$-type impurity diffusion layer 103 is formed as the lowest layer of semiconductor substrate 200. An n-type impurity diffusion layer 102 is formed on p$^+$-type impurity diffusion layer 103. An n$^-$-type impurity diffusion layer 101 is formed on n-type impurity diffusion layer 102. A p-type base layer 104 is formed on n$^-$-type impurity diffusion layer 101.

Further, a trench 108 is formed from a main surface of semiconductor substrate 200 to a prescribed depth of n$^-$-type impurity diffusion layer 101. In p-type base layer 104 in which trench 108 is formed, an n$^+$-type emitter layer 106 is formed from the main surface of semiconductor substrate 200 to the sidewall of trench 108. A p$^+$-type impurity diffusion layer 112 is formed to be adjacent to n$^+$-type emitter layer 106. A refractory metal silicide layer 116 is formed on the surface of p$^+$-type impurity diffusion layer 112.

From the surface of trench 108 to the upper surface of semiconductor substrate 200, a thermal oxide film 109 is formed by thermal oxidation. Thermal oxide film 109 functions as a gate insulation film of the IGBT. On the surface of thermal oxide film 109, a gate electrode 111 is formed to fill a recess remaining after formation of thermal oxide film 109 along the shape of trench 108. An oxide film 111a is formed on the surface of gate electrode 111.

A CVD (Chemical Vapor Deposition) oxide film 113 is formed on the surface of oxide film 111a. Silicate glass 114 is formed on CVD oxide film 113. A CVD oxide film 115 is formed at the top of silicate glass 114. A barrier metal film 117 is formed to cover the surfaces of CVD oxide films 113, 115, silicate glass 114, thermal oxide film 109, and refractory metal silicide layer 116. An aluminum interconnection layer 118 is formed on barrier metal film 117. It is noted that oxide film 111a is formed by oxidating the surface of gate electrode 111.

As described above, the conventional IGBT generally employs, as a gate insulation film, thermal oxide film 109 which is formed by thermal oxidation. For example, the techniques described in Japanese Patent Laying-Open Nos. 7-249770 and 8-172091 propose an ONO film structure insulation film, which is formed of an oxide film/a nitride film/an oxide film, as the gate insulation film of an MOS transistor, and a manufacturing method thereof.

Since the conventional MOS type FET structure as shown in FIG. 41 has several plane orientations represented by Miler indices (three planes of (100), (110), (111), for example) for the inner wall of a trench, however, the uniformity of the gate insulation film thickness of the trench inner wall is reduced. The gate insulation film is made thinner at the trench inner wall portion (the portion denoted by A in FIG. 41) and at the trench bottom (the portion denoted by B in FIG. 41) as shown in FIGS. 6 and 8, and at an edge of an oxide film which is formed by the LOCOS (LOCal Oxidation of Silicon) method as shown in FIG. 13, and therefore electric fields are locally concentrated. From the above described reason, the conventional MOS type FET has problems of degraded gate insulation film characteristics and lowered reliability.

Further, the surface of trench 108 suffers from crystal defects and stress which are caused such as by etching for forming trench 108 and by heating after formation of trench 108. Since thermal oxide film 109 which is formed by thermally oxidating the surface of trench 108 has a high defect density, interface states increase between thermal oxide film 109 and the surface of trench 108. As a result, the quality of thermal oxide film 109 as a gate insulation film may be lowered, and the transistor characteristics may be affected by the increased main junction leakage current and the lowered carrier life time of the semiconductor substrate.

When thermal oxide film 109 is to be formed, dopants in n$^+$-type emitter diffusion layer 106 and p-type base layer 104 diffuse to thermal oxide film 109 because n$^+$-type emitter diffusion layer 106 and p-type base layer 104 are formed near the sidewall of trench 108. Thus, the characteristics and reliability of thermal oxide film 109 as a gate insulation film are lowered. As a result, the MOS transistor characteristics are degraded.

In order to prevent the influences from the surface of trench 108 which is formed in semiconductor substrate 200, it is necessary to reduce the film thickness of silicon substrate 200 to be oxidated and the thermal oxidation time in the process of forming thermal oxide film 109 as a gate insulation film by thermal oxidation.

SUMMARY OF THE INVENTION

An object of the present invention is to provide a semiconductor device having an MOS structure gate electrode, in which the characteristics of a gate insulation film and a transistor are improved, and a manufacturing method thereof.

The semiconductor device according to the present invention is a field effect type semiconductor device having a stacked gate insulation film and a gate electrode on the surface of a semiconductor layer. The stacked gate insulation film includes a thermal oxide film formed on the surface of the semiconductor layer, and a CVD oxide film formed on the thermal oxide film. The ratio of the thickness of the CVD oxide film to that of the entire stacked gate insulation film is at least 20%.

According to the semiconductor device, the gate insulation film is a stacked film which is formed of the thermal oxide film and the CVD oxide film thereon and the ratio of the thickness of the CVD oxide film to that of the entire stacked gate insulation film is at least 20%, and therefore the gate insulation film having a uniform sufficient thickness without local thinner portions can be obtained. Thus, inconvenience such as current leakage in the gate insulation film can be prevented, which improves the transistor characteristics.

Preferably, the semiconductor device according to the present invention is formed so that the ratio of the thickness of the CVD oxide film to that of the entire stacked gate insulation film is at least 50%.

In the semiconductor device according to the present invention, the stacked gate insulation film preferably includes nitrogen which is segregated near at least one of an interface between the thermal oxide film and the semiconductor layer and an interface between the gate electrode and the CVD oxide film.

In the semiconductor device, nitrogen occupies portions in which the bonding of silicon for forming semiconductor substrate is incomplete, such as dangling bonds which exist near an interface between the stacked gate insulation film and the semiconductor substrate and an interface between the stacked gate insulation film and the gate electrode. Thus, the occurrence of interface states is prevented at the interface between the stacked gate insulation film and the semiconductor substrate and the interface between the stacked gate insulation film and the gate electrode.

Since an Si—H or Si—PH bond which functions as an electronic trap is replaced with an Si—N bond in the insulation film, the occurrence of electronic traps which are caused in the gate insulation film can be reduced and the diffusion of dopants in the semiconductor substrate and the gate electrode to the gate insulation film is prevented. As a result, the characteristics and reliability of the gate insulation film which is formed on the semiconductor substrate of the semiconductor device according to one aspect of the present invention are improved as compared with a gate insulation film formed of a single layer thermal oxide film of a semiconductor device in the conventional art.

In the semiconductor device according to the present invention, the stacked gate insulation film may be used as a gate insulation film of a power transistor.

In the semiconductor device according to the present invention, the semiconductor layer may have a trench provided in the semiconductor substrate, and the stacked gate insulation film may be formed along the surface of the trench.

In the semiconductor device according to the present invention, the gate electrode may be filled in a recess remaining after formation of the stacked gate insulation film, and the gate electrode may have its surface located above a main surface of the semiconductor substrate.

In the semiconductor device according to the present invention, the gate electrode may be filled in a recess remaining after formation of the stacked gate insulation film, and the gate electrode may have its surface located at or below the main surface of the semiconductor substrate.

In the semiconductor device according to the present invention, the stacked gate insulation film may further include a silicon nitride film.

In the semiconductor device according to the present invention, the stacked gate insulation film may further include an oxynitride film (nitrided oxide film) which is formed by oxidating the surface of the silicon nitride film.

In the semiconductor device according to the present invention, the stacked gate insulation film may further include another CVD oxide film on the oxynitride film.

The method of manufacturing a semiconductor device according to the present invention is a method of manufacturing a field effect type semiconductor device having a stacked gate insulation film and a gate electrode on a semiconductor layer. The step of forming the stacked gate insulation film includes the steps of forming a thermal oxide film on the semiconductor layer by thermal oxidation, and forming a CVD oxide film on the thermal oxide film by the CVD method so that the ratio of the thickness of the CVD oxide film to that of the entire stacked gate insulation film is at least 20%.

According to the method of manufacturing a semiconductor device, the CVD oxide film is formed so that the ratio of the thickness of the CVD oxide film to that of the entire stacked gate insulation film is at least 20%, and therefore the stacked gate insulation film can be formed to have a uniform sufficient thickness as compared with a manufacturing method in which a gate insulation film is formed of a single layer thermal oxide film. Thus, local thinning of the gate insulation film can be prevented. As a result, the gate insulation film characteristics can be improved, which allows manufacture of a semiconductor device with improved transistor characteristics.

In the method of manufacturing a semiconductor device according to the present invention, the CVD oxide film is preferably formed in the step of forming the CVD oxide film so that the ratio of the thickness of the CVD oxide film to that of the entire stacked gate insulation film is at least 50%.

In the method of manufacturing a semiconductor device according to the present invention, the step of forming the stacked gate insulation film preferably further includes the step of forming the thermal oxide film and then nitriding the thermal oxide film to segregate nitrogen near an interface between the thermal oxide film and the semiconductor layer.

In the method of manufacturing a semiconductor device according to the present invention, the step of forming the stacked gate insulation film preferably further includes the step of forming the CVD oxide film and then nitriding the CVD oxide film to segregate nitrogen near an interface between the thermal oxide film and the semiconductor layer and an interface between the gate electrode and the CVD oxide film.

By using such a manufacturing method, nitrogen can occupy portions in which silicon bonding is incomplete, such as dangling bonds which exist near an interface between the stacked gate insulation film and the semiconductor substrate and an interface between the stacked gate insulation film and the gate electrode. Thus, the occurrence of interface states can be prevented at the interface between the stacked gate insulation film and the gate electrode. Since an Si—H or Si—OH bond which functions as an electronic trap in the oxide film can be replaced with an Si—N bond, electronic traps in the gate insulation film can be reduced. Further, the diffusion of dopants in the semiconductor substrate and the gate electrode to the gate insulation film can be prevented. As a result, such a semiconductor device can be manufactured that includes a gate insulation film with improved gate insulation film characteristics and reliability as compared with a single layer thermal oxide film of a semiconductor device in the prior art.

In the method of manufacturing a semiconductor device according to the present invention, the semiconductor layer may be constituted by a semiconductor substrate provided a trench therein, and the thermal oxide film may be formed along the trench surface in the step of forming the thermal oxide film.

In the method of manufacturing a semiconductor device according to the present invention, the step of forming the stacked gate insulation film may further include the step of forming, after forming the CVD oxide film, a silicon nitride film on the CVD oxide film.

In the method of manufacturing a semiconductor device according to the present invention, the step of forming the stacked insulation film may further include the step of forming, after forming the silicon nitride film, an oxynitride film by oxidating the surface of the silicon nitride film.

In the method of manufacturing a semiconductor device according to the present invention, the step of forming the stacked gate insulation film may further include the step of forming a silicon nitride film on the thermal oxide film after forming the thermal oxide film or the step of forming, after oxidating the surface of the silicon nitride film, another CVD oxide film on the oxynitride film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 16 to 18 are partially sectional views showing another example of a collector structure of the IGBT which has an MOS structure formed in a trench in the first embodiment of the present invention.

FIG. 19 shows the conditions of gate insulation films as samples which are evaluated in terms of gate insulation film characteristics and transistor characteristics in the first embodiment of the present invention.

DESCRIPTION OF THE PREFERRED EMBODIMENTS

In the following, the embodiments of the present invention will be described with reference to the drawings.

First Embodiment

Figure 1:
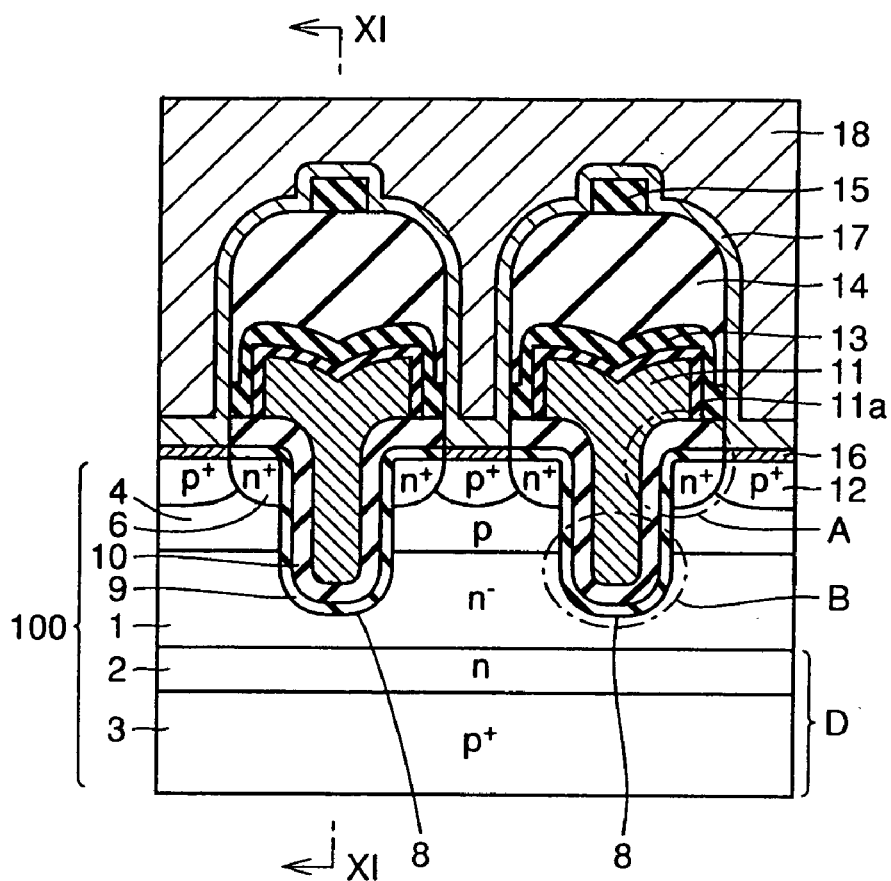
FIG. 1 shows a sectional structure of an IGBT which has an MOS structure formed in a trench in a first embodiment of the present invention.

The structure of an IGBT which has an MOS structure formed in a trench as a semiconductor device in a first embodiment of the present invention includes impurity layers as described below which are formed in a silicon semiconductor substrate 100 as shown in FIG. 1. A p$^+$-type impurity diffusion layer 3 is formed as the lowest layer of semiconductor substrate 100. An n-type impurity diffusion layer 2 is formed on p$^+$-impurity diffusion layer 3. An n$^-$-type impurity diffusion layer 1 is formed on n-type impurity diffusion layer 2. A p-type base layer 4 is formed on n$^-$-type impurity diffusion layer 1.

A trench 8 is formed from a main surface of semiconductor substrate 100 to a prescribed depth of n$^-$-type impurity diffusion layer 1. In p-type base layer 4 beside trench 8, an n$^+$-type emitter layer 6 is formed from the main surface of semiconductor substrate 100 to the sidewall of trench 8. A p$^+$-type impurity diffusion layer 12 is formed to be adjacent to n$^+$-type emitter layer 6. A refractory metal silicide layer 16 is formed on the surface of p$^+$-type impurity diffusion layer 12 and n$^+$-type impurity diffusion layer 6.

From the surface of trench 8 to the surface of semiconductor substrate 100 which is formed of a silicon substrate, a thermal oxide film 9 of a silicon oxide film is formed by oxidating part of the surface of trench 8 and the top surface of semiconductor substrate 100. To cover the surface of thermal oxide film 9, a CVD oxide film 10 is formed which is a silicon oxide film provided by the CVD method. A gate electrode 11 is formed to fill a recess remaining after formation of CVD oxide film 10 and to extend from the surface of semiconductor substrate 100 to a prescribed height. An oxide film 11a is formed on the surface of gate electrode 11. A CVD oxide film 13 is formed to cover the surface of oxide film 11a. Silicate glass 14 is formed on CVD oxide film 13.

A CVD oxide film 15 is formed at the top of silicate glass 14. A barrier metal film 17 is formed to cover the surfaces of silicate glass 14, CVD oxide film 15, and refractory metal silicide layer 16. An aluminum interconnection layer 18 is formed to cover the surface of barrier metal film 17. It is noted that polycrystalline silicon containing phosphorus of high concentration or a material which is prepared by ion-implanting phosphorus into polycrystalline silicon is employed for gate electrode 11.

The IGBT of the present invention is an MOS structure semiconductor device which has a stacked gate insulation film including at least two types of insulation films, that is, thermal oxide film 9 provided on semiconductor substrate 100 and CVD oxide film 10 provided nearer to gate electrode 11 than thermal oxide film 9. The IGBT is characterized in that the ratio of the thickness of CVD oxide film 10 to that of the entire stacked insulation film is at least 20%.

In the following, a method of manufacturing the IGBT in this embodiment will be described with reference to FIGS. 1 to 4. In the method of manufacturing the IGBT in this embodiment, p$^+$-type impurity diffusion layer 3 which has a surface concentration (impurity concentration at the surface) of at least $2 \times 10^{18}$ cm$^{-3}$ and a diffusion depth of at least 0.3 μm is first formed as the lowest layer of silicon semiconductor substrate 100. Then, n-type impurity diffusion layer 2 which has a peak concentration of at most $1 \times 10^{18}$ cm$^{-3}$ and a diffusion depth of at most 400 μm is formed on p$^+$-type impurity diffusion layer 3 by epitaxial growth.

Thereafter, n$^-$-type impurity diffusion layer 1 which has a surface concentration of $1 \times 10^{12}$ cm$^{-3}$ to $1 \times 10^{14}$ cm$^{-3}$ and a diffusion depth of 40 μm to 600 μm is formed on n-type impurity diffusion layer 2 by epitaxial growth. It is noted that n$^-$-type impurity diffusion layer 1 and n-type impurity diffusion layer 2 may be formed by annealing after ion implantation into the silicon substrate on p$^+$-type impurity diffusion layer 3.

In the forgoing, the semiconductor substrate is formed by providing p$^+$-type impurity diffusion layer 3 as a base layer. However, n$^-$-type impurity diffusion layer 1 may be formed as a base layer and then n-type impurity diffusion layer 2 and p$^+$-type impurity diffusion layer 3 may be formed successively on n$^-$-type impurity diffusion layer 1 by epitaxial growth. It is noted that p$^+$-type impurity diffusion layer 3 and n-type impurity diffusion layer 2 may be formed by annealing after ion implantation into the silicon substrate.

Figure 2:
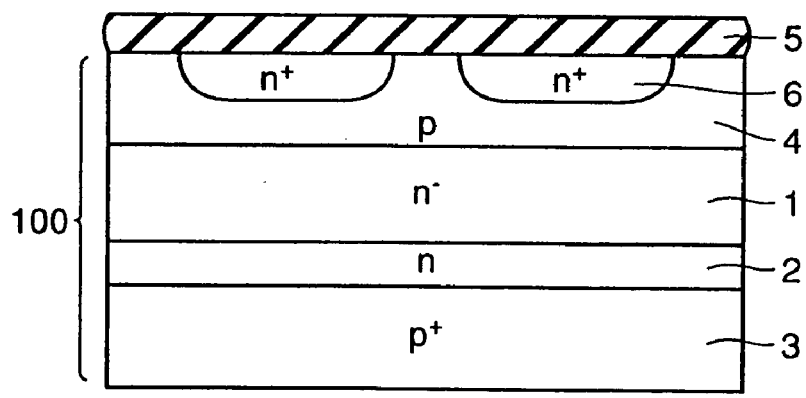
FIGS. 2 to 4 are sectional views for illustrating a manufacturing method of the IGBT which has an MOS structure formed in a trench in the first embodiment of the present invention.

Near the surface of semiconductor substrate 100 (surface of n$^-$-type impurity diffusion layer 1), p-type base layer 4 which has a peak concentration of $1 \times 10^{15}$ cm$^{-3}$ to $1 \times 10^{18}$ cm$^{-3}$ and a diffusion depth of 1 μm to 4 μm, for example, is then formed above the bottom surface of trench 8. Thereafter, n$^+$-type emitter diffusion layer 6 which has a surface concentration of $1 \times 10^{18}$ cm$^{-3}$ to $1 \times 10^{20}$ cm$^{-3}$ and a diffusion depth of 0.3 μm to 2 μm is formed from the main surface of semiconductor substrate 100 to the sidewall of trench 8. Then, thermal oxide film 5 is formed on the main surface of semiconductor substrate 100. As a result, the structure shown in FIG. 2 is obtained.

Figure 3:
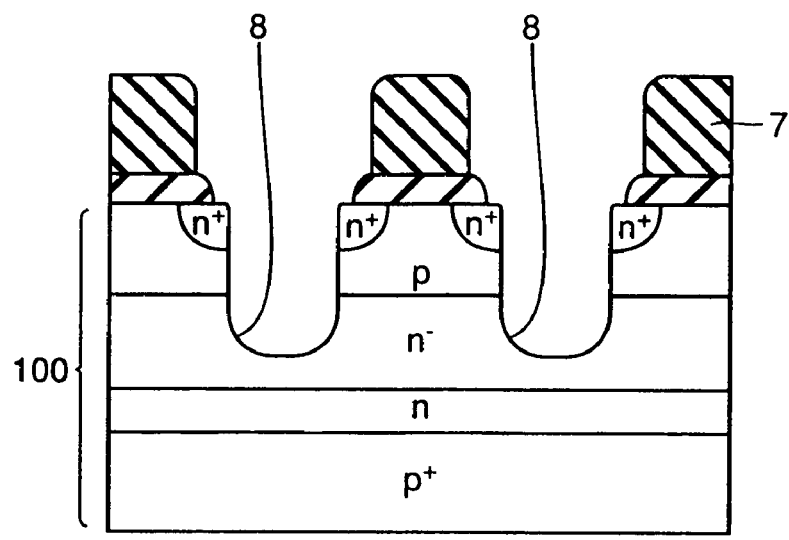

Thereafter, CVD oxide film 7 is formed on thermal oxide film 5. Thereafter, CVD oxide film 7 is patterned. Then, semiconductor substrate 100 is etched by using CVD oxide film 7 and thermal oxide film 5 as a mask to form trench 8, in a region where n$^+$-type emitter diffusion layer 6 is formed, from the main surface of semiconductor substrate 100 to a prescribed depth. Thus, the structure shown in FIG. 3 is obtained.

Then, a pre-process to improve the characteristics of thermal oxide film 9 which is to be a gate insulation film formed in a trench, for example, the process described in U.S. Pat. No. 5,783,491 and Japanese Patent Laying-Open No. 7-263692 is provided on the surface of trench 8. Thus, the sidewall and bottom portions of trench 8 are rounded and the inner wall portion is smoothed.

In this embodiment, a thermal oxide film 9a is then formed on the inner wall of trench 8 by thermal oxidation. Thereafter, a CVD oxide film 10a is formed on thermal oxide film 9a by the LPCVD (Low Pressure Chemical Vapor Deposition) method. Thus, the stacked gate insulation film of thermal oxide film 9a and CVD oxide film 10a is formed.

If the thickness of thermal oxide film 9a is tox (9), the thickness of CVD oxide film 10a is tox (10), and the total thickness of the gate insulation film which determines the threshold voltage ($V_{TH}$) of an MOS transistor is tox (total)

at this time, the thickness of each oxide film satisfies the conditions of the following expressions.

$$tox(9) \leq 0.2tox(\text{total})$$

$$tox(10) \geq 0.2tox(\text{total})$$

After forming CVD oxide film 10a, annealing is performed to make CVD oxide film 10a finer and to form a new layer with a low defect density at an interface between thermal oxide film 9 and silicon substrate 100.

Figure 4:
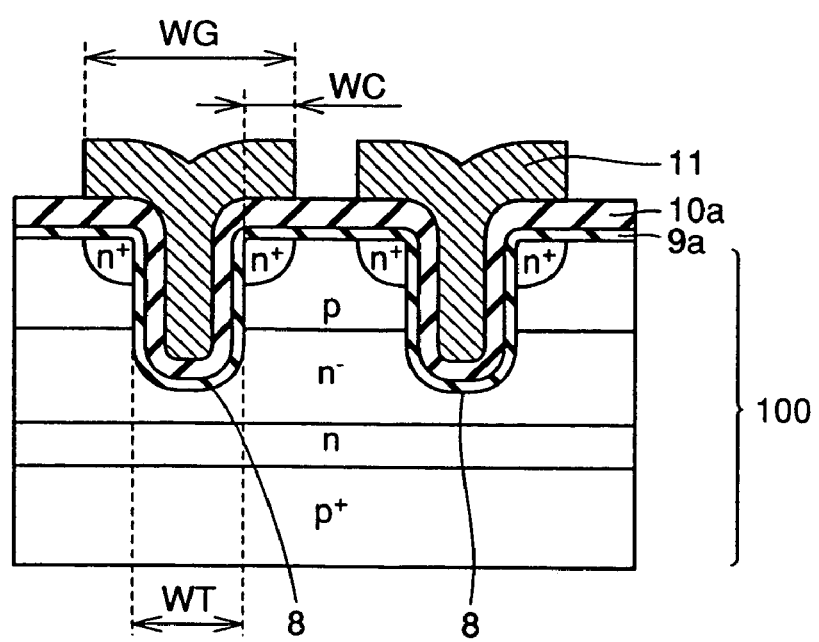

As shown in FIG. 4, gate electrode 11 which is filled in a recess formed by thermal oxide film 9a and CVD oxide film 10a that are formed along the surface of trench 8 is formed by photolithography and etching. If the width of a portion of gate electrode 11 which protrudes from the surface of semiconductor substrate 100 is WG, the trench width is WT, and the distance from an edge of gate electrode 11 which protrudes from the surface of semiconductor substrate 100 to an edge of the sidewall of trench 8 is WC at this time, patterning dimensions satisfy the following relations.

$$WG \geq 1.3WT$$

$$WC \geq 0.2 \ \mu m$$

Although not formed in the IGBT in this embodiment, a titanium silicide film expressed by chemical formula TiSi or a refractory metal silicide layer of cobalt silicide expressed by chemical formula CoSi may be formed on the surface of gate electrode 11 to reduce gate resistance.

Then, the surface of gate electrode 11 is oxidated to form oxide film 11a. In a region where the surface of the semiconductor substrate is exposed, p$^+$-type impurity diffusion layer 12 which has a surface concentration of $1 \times 10^{18}$ cm$^{-3}$ to $1 \times 10^{20}$ cm$^{-3}$ and a diffusion depth smaller than n$^+$-type emitter diffusion layer 6 is then formed to be adjacent to n$^+$-type emitter diffusion layer 6. Thereafter, a CVD oxide film is formed on oxide film 11a.

Thereafter, silicate glass is formed on the CVD oxide film. Thereafter, another CVD oxide film is formed on the silicate glass. Then, a contact hole is formed which passes through the silicate glass, the CVD oxide film, CVD oxide film 10a, and thermal oxide film 9a and reaches p$^+$-type impurity diffusion layer 12 and n$^+$-type impurity diffusion layer 6. Thus, thermal oxide film 9 and CVD oxide film 10 which function as a gate insulation film, CVD oxide film 13 and silicate glass 14 are formed.

Then, silicide layer 16 is formed on the surface of p$^+$-type impurity diffusion layer 12 and n$^+$-type impurity diffusion layer 6 such as by sputtering and lamp annealing. Thereafter, CVD oxide film 15 is formed at the top of silicate glass 14. Then, barrier metal 17 is formed to cover silicate glass 14, CVD oxide film 15, and silicide layer 16. Thereafter, aluminum interconnection layer 18 is formed on barrier metal 17. The IGBT in this embodiment shown in FIG. 1 is completed in this manner.

Although oxide film 11a is formed by oxidating the surface of the gate electrode in this embodiment, oxide film 11a does not have to be provided to prevent the phenomenon that the gate oxide film characteristics are deteriorated by oxidation of dopants in gate electrode 11.

Figure 5:
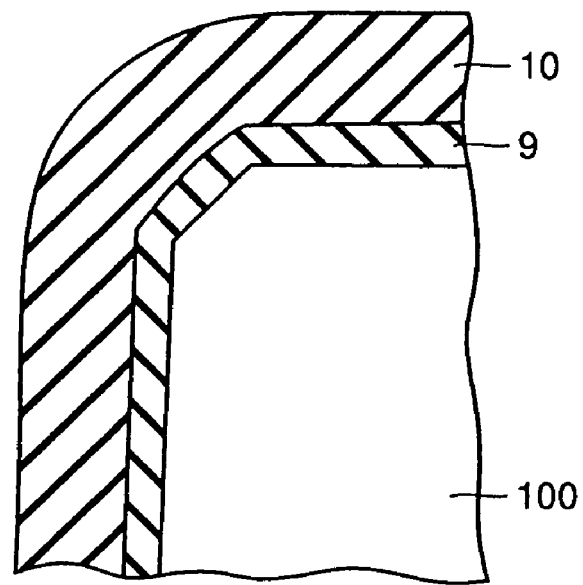
FIG. 5 is a partially sectional view showing the shape of a portion between the trench sidewall of the first embodiment of the present invention and the surface of a semiconductor substrate.
Figure 6:
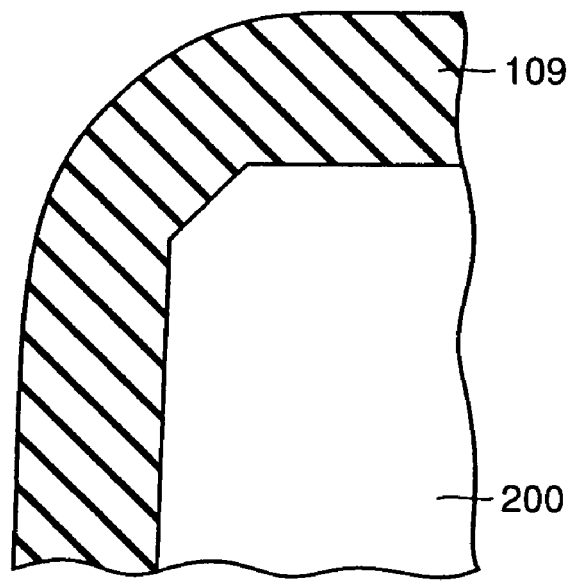
FIG. 6 is a partially sectional view showing the shape of a portion between the trench sidewall of a conventional sample and the surface of a semiconductor substrate.
Figure 7:
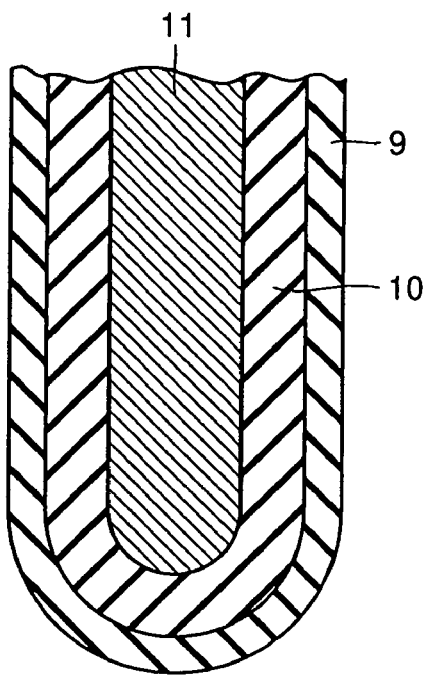
FIG. 7 is a partially sectional view showing the shape of a trench bottom of the first embodiment of the present invention.
Figure 8:
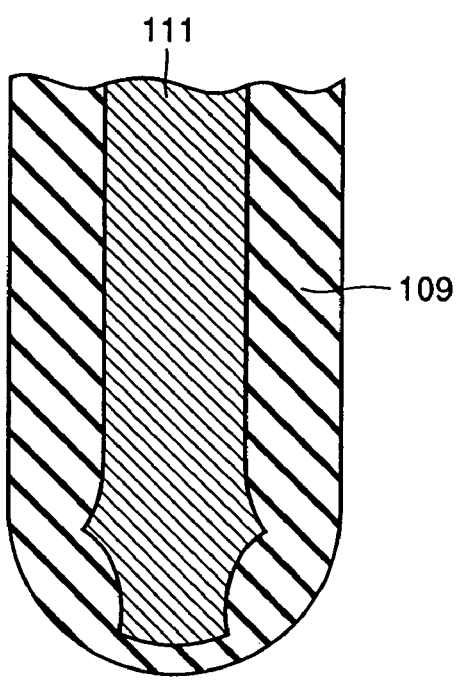
FIG. 8 is a partially sectional view showing the shape of a trench bottom of the conventional sample.
Figure 9:
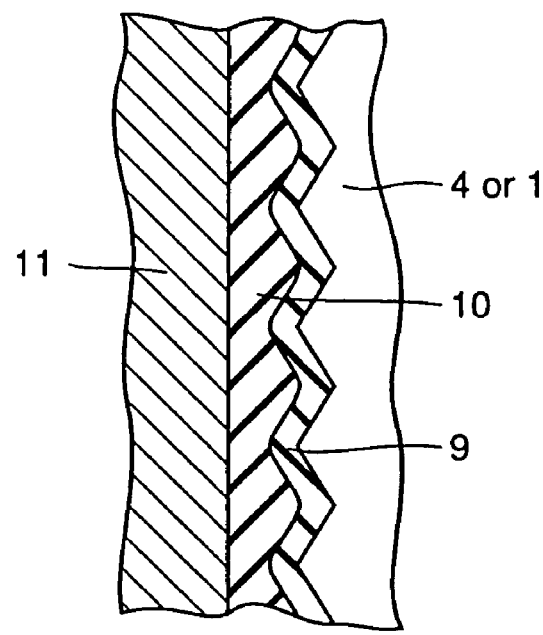
FIG. 9 is a partially sectional view showing the shape of a trench sidewall portion of the first embodiment of the present invention.

In the IGBT thus formed in this embodiment, the stacked gate insulation film of thermal oxide film 9 and CVD oxide film 10 has a uniform sufficient thickness even at the inner wall and bottom portions of trench 8 as shown in FIGS. 5 and 7. This means that such local thinning as in the conventional example shown in FIGS. 6 and 8 is not observed.

Figure 10:
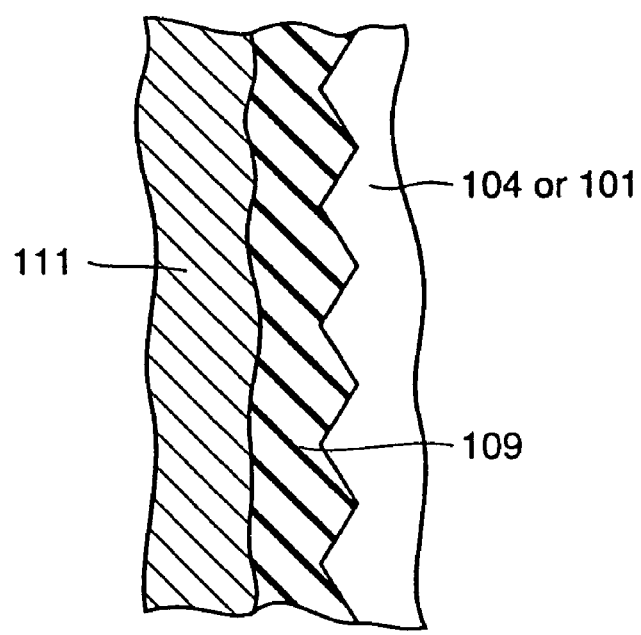
FIG. 10 is a partially sectional view showing the shape of a trench sidewall portion of the conventional sample.

If the gate insulation film is formed only of thermal oxide film 9 as in the conventional art, the surface of the inner wall portion of trench 108 is highly irregular as shown in FIG. 10, and therefore the gate insulation film has a shape which conforms to the surface roughness of trench 108. If the stacked gate insulation film in this embodiment is used, however, such local thinning of thermal oxide film 9 as part of the gate insulation film that is caused by the surface roughness of the trench is compensated by CVD oxide film 10. It can be seen as a result that the gate insulation film characteristics are improved, resulting in the improved transistor characteristics.

Figure 11:
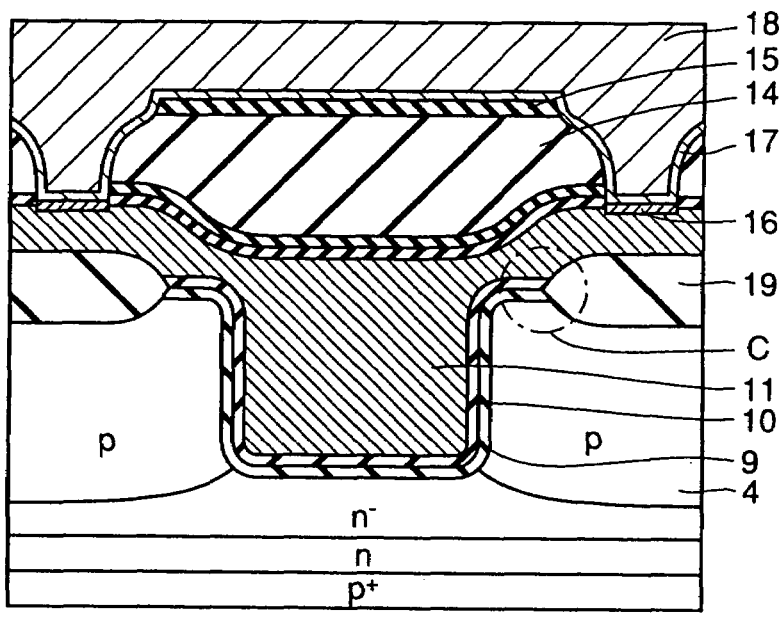
FIG. 11 shows a section along line X1—X1 in FIG. 1.
Figure 12:
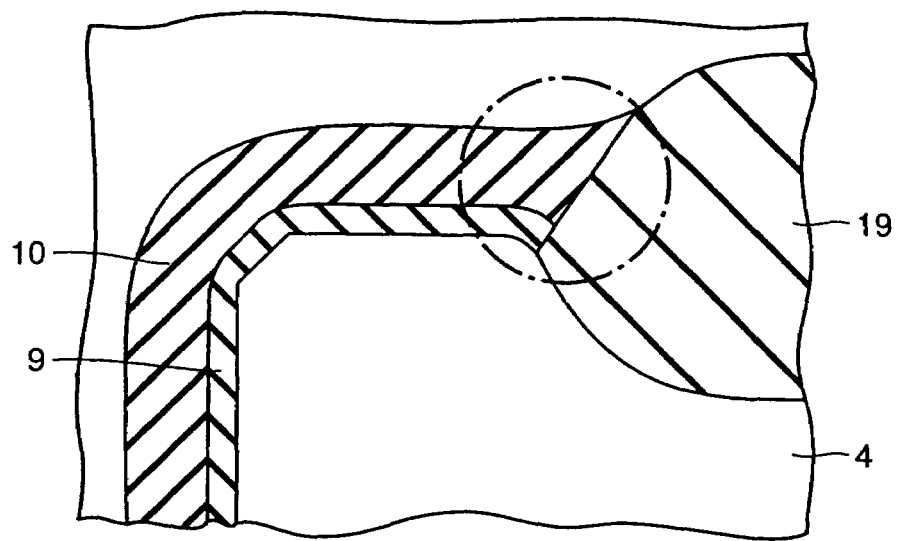
FIG. 12 is a partially sectional view showing the shape of an edge of an oxide film, which is formed by the LOCOS method, of the IGBT in the first embodiment of the present invention.
Figure 13:
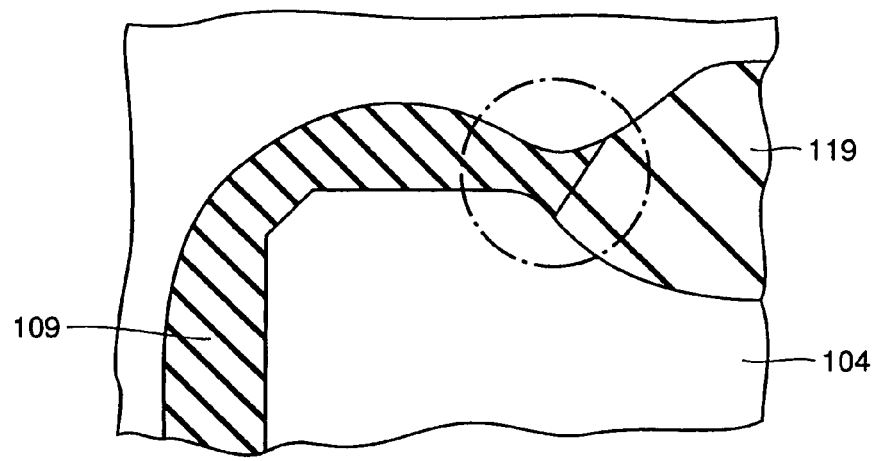
FIG. 13 is a partially sectional view showing the shape of an edge of an oxide film, which is formed by the LOCOS method, of the conventional IGBT.

As shown in FIG. 11 which is a sectional view along line X1—X1 in FIG. 1 as well as FIG. 12 which is an enlarged view of an edge of the oxide film formed by the LOCOS method in FIG. 11, CVD oxide film 10 exists even on thermal oxide film 9 which is positioned on p-type impurity diffusion layer 4 near an edge of thick oxide film 19 formed by the LOCOS method in the IGBT in this embodiment. Therefore, local thinning of the gate insulation film is prevented even at an edge of thick oxide film 19 which is formed by the LOCOS method. As a result, the occurrence of local concentration of electric fields is prevented at the edge of oxide film 19 which is formed by the LOCOS method in this embodiment. It can be seen from this that the quality of a gate insulation film is improved even at the edge of oxide film 9 which is formed by the LOCOS method in this embodiment shown in FIG. 12 as compared with the edge of oxide film 119 which is formed by the LOCOS method of the conventional IGBT shown in FIG. 13.

Figure 14:
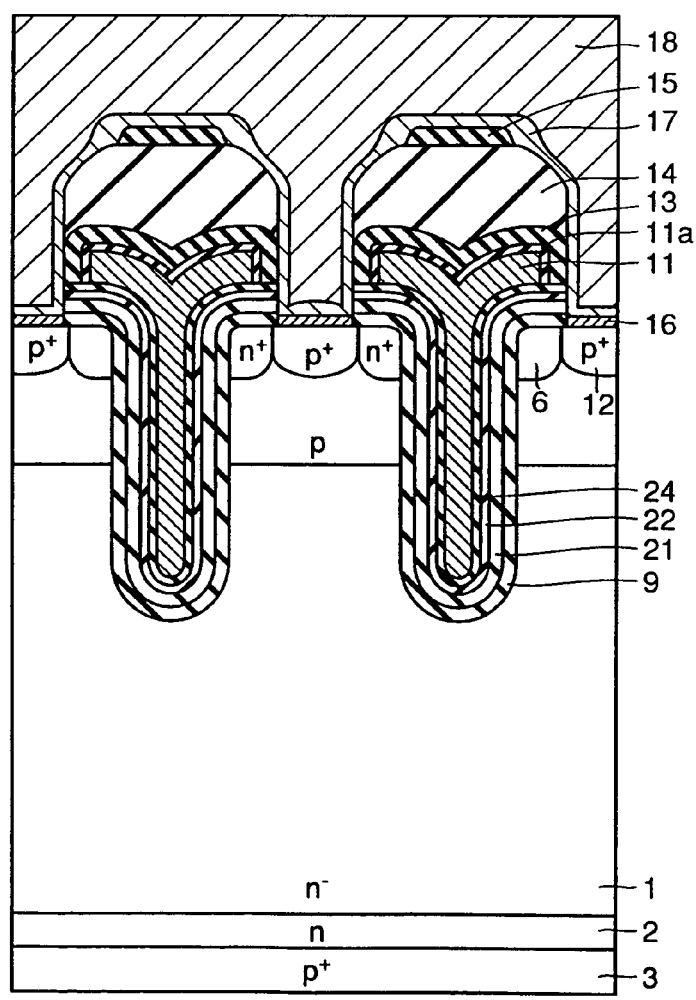
FIG. 14 is a sectional view showing an IGBT which has an MOS structure formed in a trench in another example of the first embodiment of the present invention.
Figure 15:
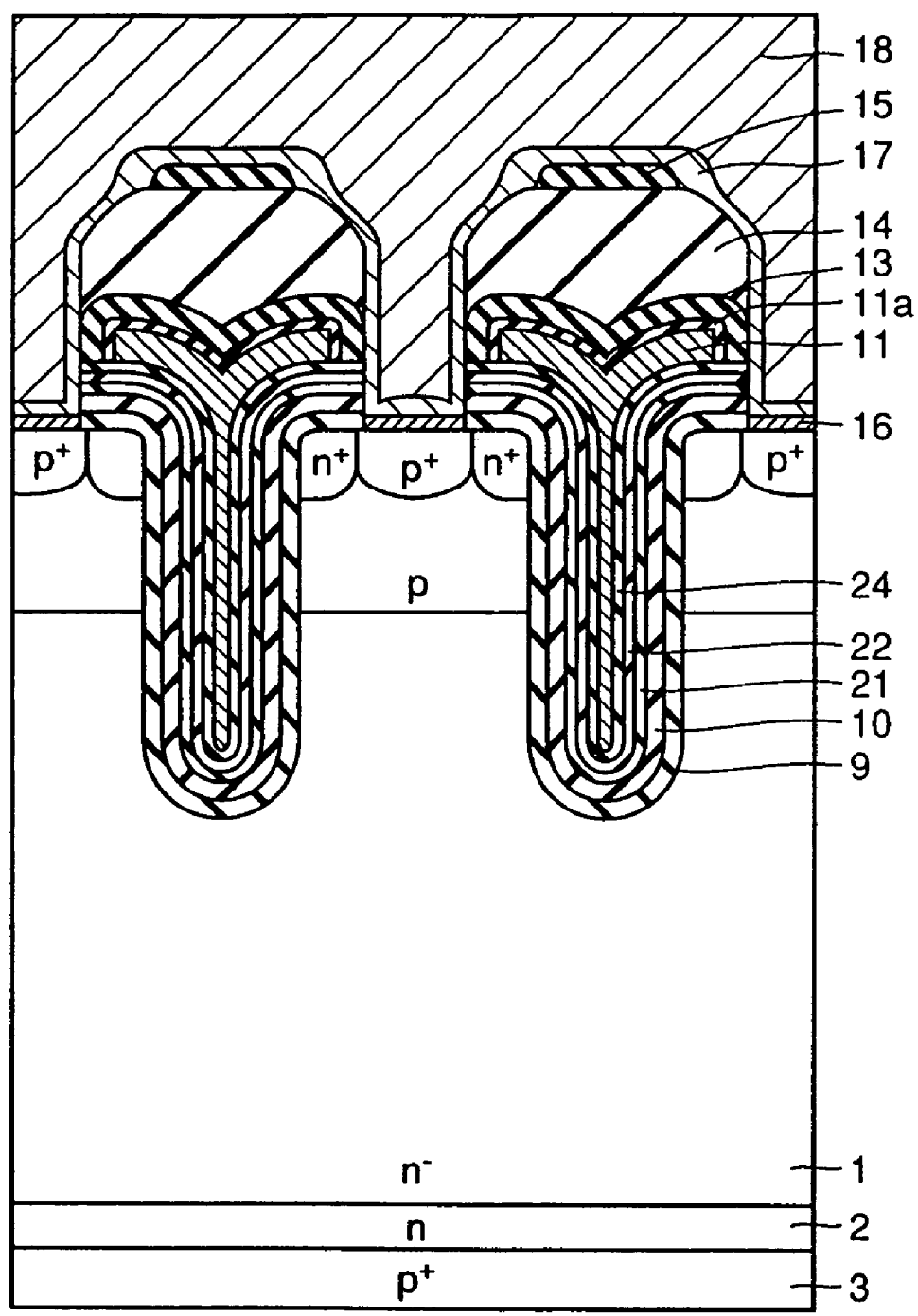
FIG. 15 is a sectional view showing an IGBT which has an MOS structure formed in a trench in still another example of the first embodiment of the present invention.

Although the stacked gate insulation film formed of two types of insulation films, that is, thermal oxide film 9 and CVD oxide film 10 is described for the IGBT in this embodiment, the combination for the stacked gate insulation film is not limited to the one above. As another example of the IGBT structure which can attain similar effects to those of the IGBT in this embodiment, the stacked insulation film may further include a silicon nitride film 21 as shown in FIGS. 14 and 15. Further, the stacked insulation film may further include a CVD oxide film 24 in addition to or instead of CVD oxide film 10. Further, the stacked insulation film can be used in which nitrogen is segregated near at least one of an interface between thermal oxide film 9 and semiconductor substrate 100 and an interface between gate electrode 11 and CVD oxide film 24.

The IGBT structure including another example of the trench MOS structure in this embodiment is implemented by the manufacturing methods of a stacked gate insulation film as described in the following (1) to (4).

(1) First, thermal oxide film 9 is formed on the surface of trench 8. Thereafter, thermal oxide film 9 is nitrided at the temperature condition of 900° C. to 1100° C. in an atmosphere which contains at least one of $N_2O$, $NH_3$ and NO gasses. Thus, an oxynitride film with nitrogen segregated near an interface between thermal oxide film 9 and semiconductor substrate 100 is formed. Thereafter, CVD oxide film 10 is formed on thermal oxide film 9 by the CVD method to form the stacked gate insulation film as shown in FIG. 1.

(2) First, thermal oxide film 9 and CVD oxide film 10 are formed on the surface of trench 8 by a manufacturing method similar to that of the stacked gate insulation film of the IGBT shown in FIG. 1 in this embodiment. Thereafter, thermal oxide film 9 and CVD oxide film 10 are nitrided at the temperature condition of 900° C. to 1100° C. in an atmosphere which contains at least one of $N_2O$, $NH_3$ and NO gasses. Thus, a stacked gate insulation film is formed which includes an oxynitride film with nitrogen segregated near an interface between thermal oxide film 9 and semiconductor substrate 100 and an interface between a gate electrode and CVD oxide film 10.

(3) First, thermal oxide film 9 is formed on the surface of trench 8. Thereafter, silicon nitride film 21 expressed by chemical formula $Si_3N_4$ is formed by LPCVD. In order to remove traps, hydrogen and pinholes in silicon nitride film 21, the surface of silicon nitride film 21 is oxidated to form oxide film 22. Thereafter, CVD oxide film 24 is formed by the LPCVD method. Thus, the stacked gate insulation film formed of thermal oxide film 9, silicon nitride film 21, oxide film 22, and CVD oxide film 24 as shown in FIG. 14 is formed. Here, CVD oxide film 24 may not be formed.

(4) Thermal oxide film 9 and CVD oxide film 10 are formed on the surface of trench 8. Thereafter, silicon nitride film 21 is formed on CVD oxide film 10 by the LPCVD method. In order to remove traps, hydrogen and pinholes in silicon nitride film 21, the surface of silicon nitride film 21 is oxidated to form oxide film 22. Thereafter, another CVD oxide film 24 is formed by the LPCVD method. Thus, the stacked insulation film formed of thermal oxide film 9, CVD oxide film 10, silicon nitride film 21, oxide film 22, and CVD oxide film 24 is formed as shown in FIG. 15. Here, CVD oxide film 24 may not be formed.

Although the IGBT of the $p^+$-type collector structure is described in this embodiment, the combination for the IGBT collector structure to which present invention is applied is not limited to it. For example, IGBTs of the $p^+/p^-$ collector structure as shown in FIG. 16, the $p^-/n^+$ collector structure as shown in FIG. 17, and the p-type collector structure as shown in FIG. 18 can also attain the effects of the IGBT structure in this embodiment shown in FIG. 1.

The effects of the IGBT in this embodiment are recognized by using a comparative example, and the recognition method will be described below. Five types of samples A to E, that is, four types of stacked gate insulation films of the trench MOS gate structure in this embodiment and a comparative gate insulation film of the trench MOS gate structure are evaluated in terms of gate insulation film characteristics and transistor characteristics. The result will be described in the following. The gate insulation film conditions of each sample are shown in FIG. 19. Here, sample A employs an IGBT which has a gate insulation film only of a thermal oxide film described in the conventional art, samples B, C, and D employ an MOS gate structure which has a stacked gate insulation film in this embodiment, and sample E employs an MOS gate structure which has a gate insulation film only of a CVD oxide film as a comparative example.

Figure 20:
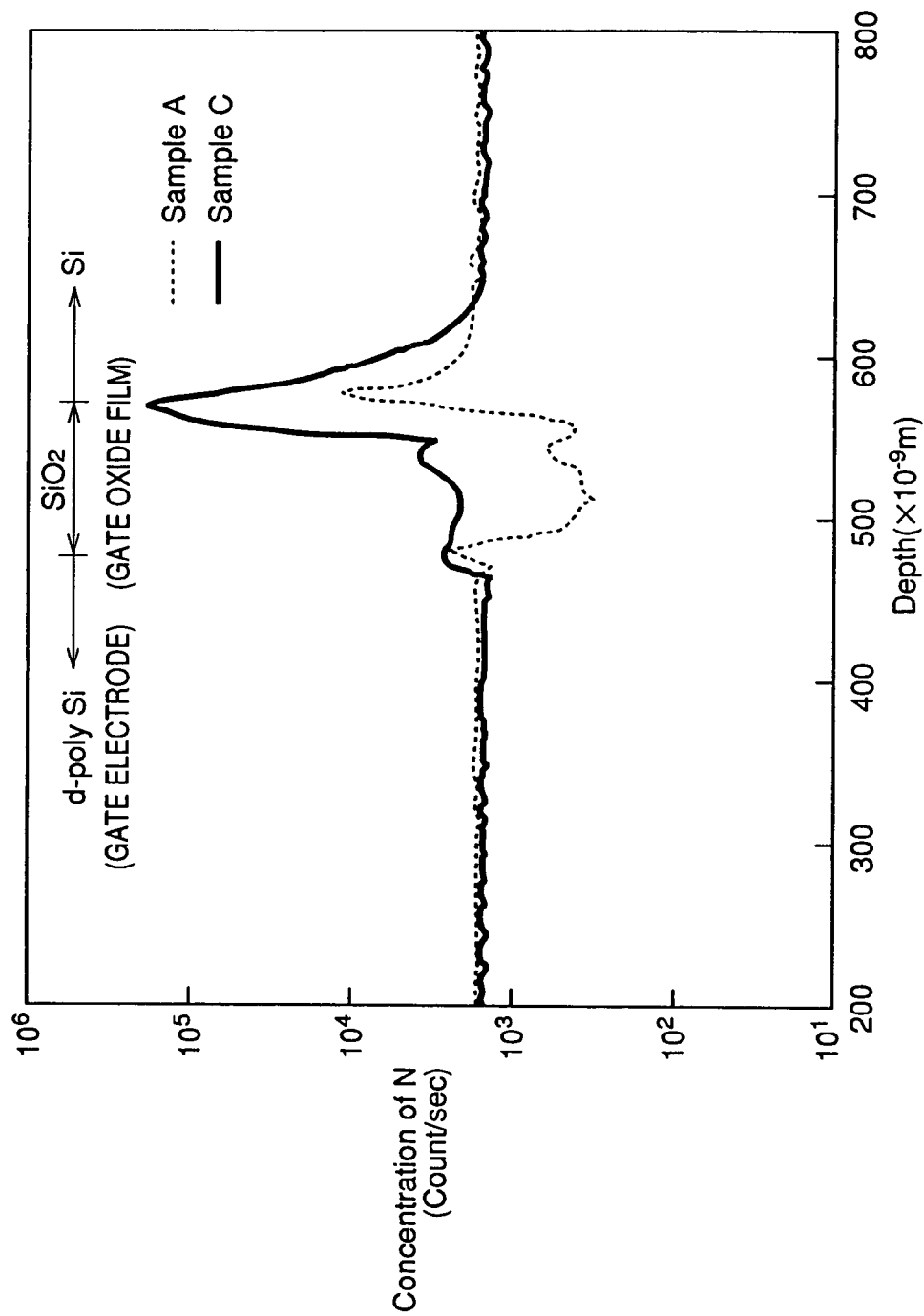
FIG. 20 illustrates the result of nitrogen concentration measurement from the surface of the gate electrode to the surface of the semiconductor substrate using SIMS (Secondary Ion Mass Spectrometry) in the first embodiment of the present invention.

FIG. 20 illustrates the result of measuring, by SIMS, samples A and C in terms of the nitrogen concentration from the gate electrode surface to the semiconductor substrate. In FIG. 20, the vertical and horizontal axes denote the nitrogen concentration and the measurement depth, respectively. It can be seen in sample C in this embodiment that the nitrogen concentration is very high near an interface between the gate oxide film and the semiconductor substrate as compared with sample A described in the conventional art.

Sample C has nitrogen which is segregated near at least one of an interface between the stacked gate insulation film and the semiconductor substrate and an interface between the gate electrode and the stacked gate insulation film. Therefore, nitrogen occupies portions in which silicon bonding is incomplete, such as dangling bonds which exist near the interface between the stacked gate insulation film and the semiconductor substrate and the interface between the stacked gate insulation film and the gate electrode. Thus, the occurrence of interface states due to the dangling bonds is suppressed.

Further, Si—H and Si—OH bonds which function as electronic traps are replaced with Si—N bonds in the gate oxide film, and therefore the electronic trap action in the gate insulation film is reduced and the diffusion of dopants in the semiconductor substrate and the gate electrode to the gate insulation film is prevented.

It can be seen from the results that the characteristics and reliability of the gate insulation film which is formed on the trench inner wall of the IGBT in this embodiment are improved as compared with the gate insulation film described in the conventional art. In this embodiment, the hot carrier resistance of an MOS transistor in the trench sidewall is also improved, which increases the transconductance in a channel region.

Figure 21:
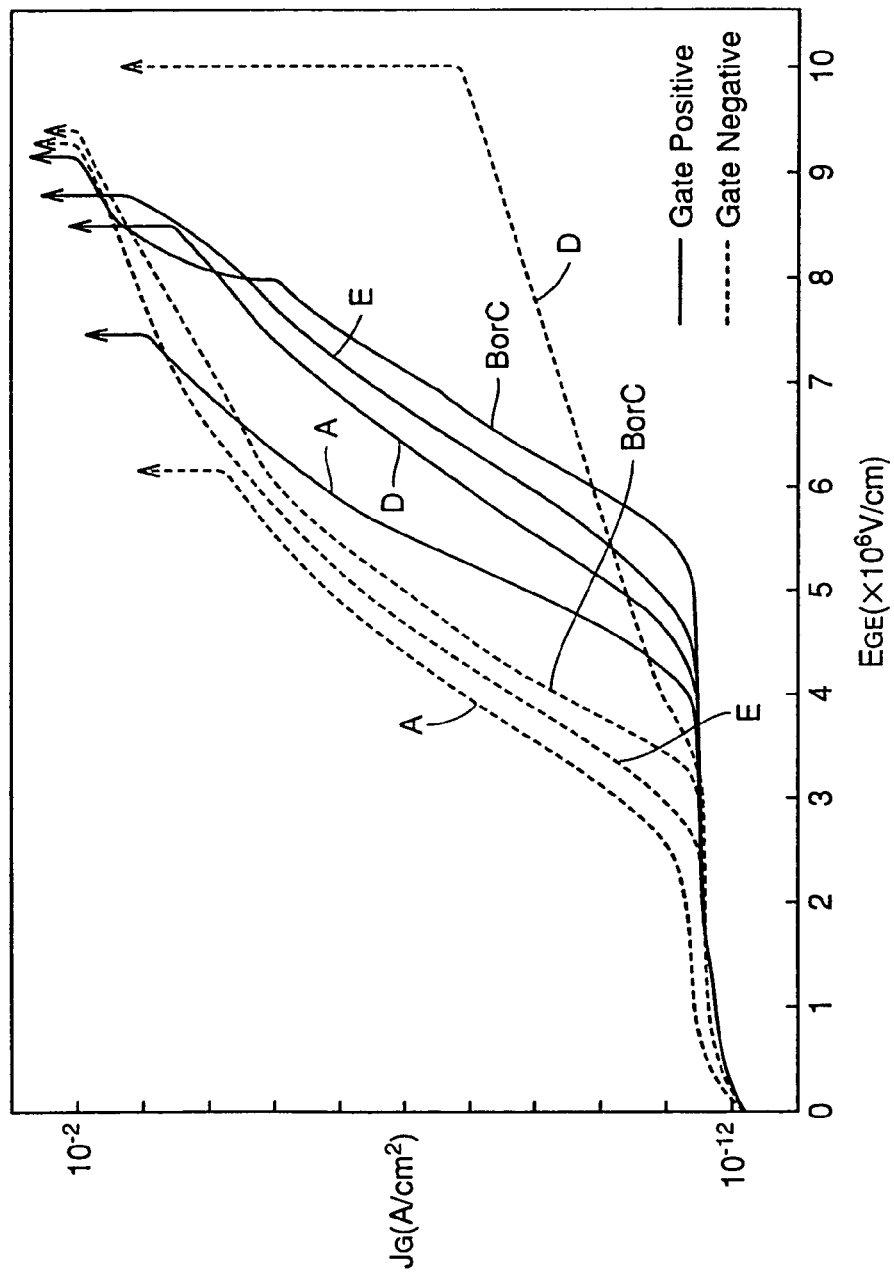
FIG. 21 illustrates the result of evaluating how the leakage characteristics of a gate insulation film of the MOS capacitor which has an MOS structure formed in a trench depend on a gate bias in the first embodiment of the present invention.
Figure 22:
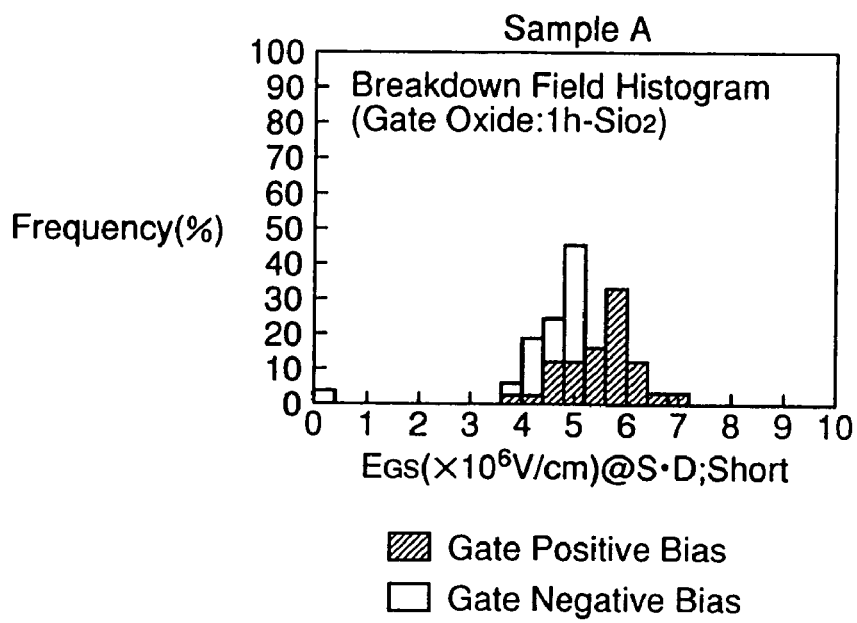
FIGS. 22 to 25 illustrate the result of evaluating how the withstand pressure distribution of the gate insulation film of the IGBT or MOSFET which has an MOS structure formed in a trench depends on a gate bias in the first embodiment of the present invention.
Figure 23:
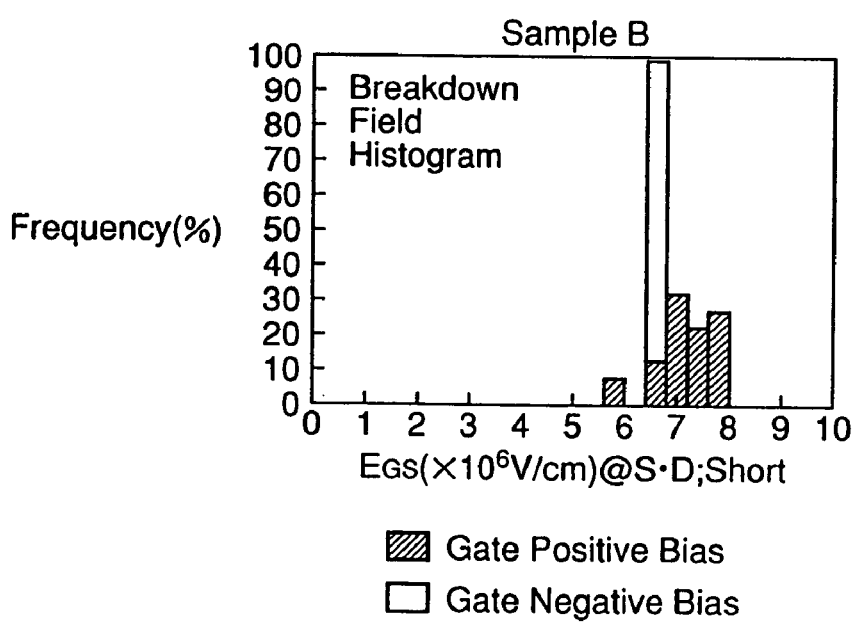
Figure 24:
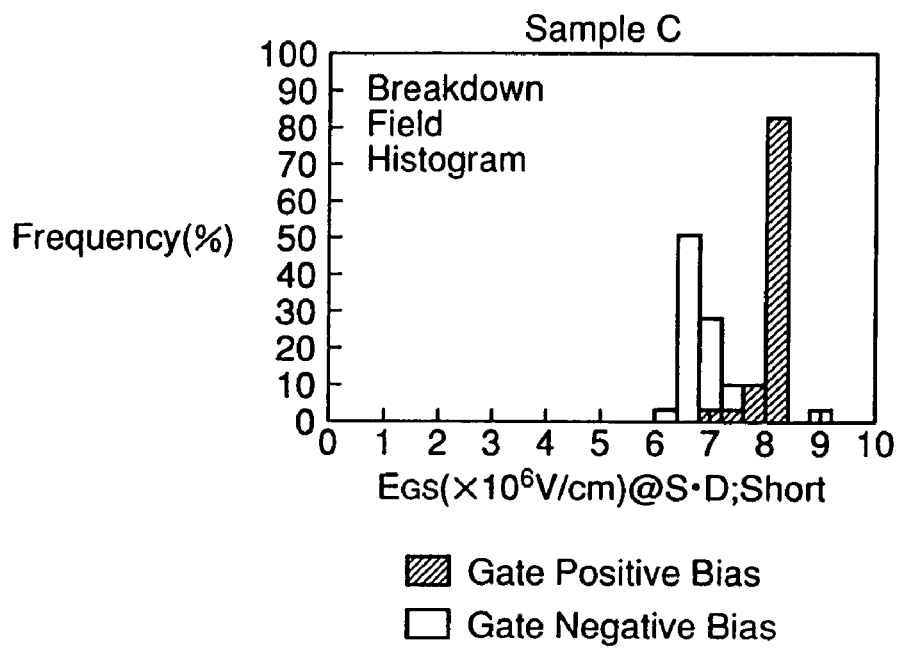
Figure 25:
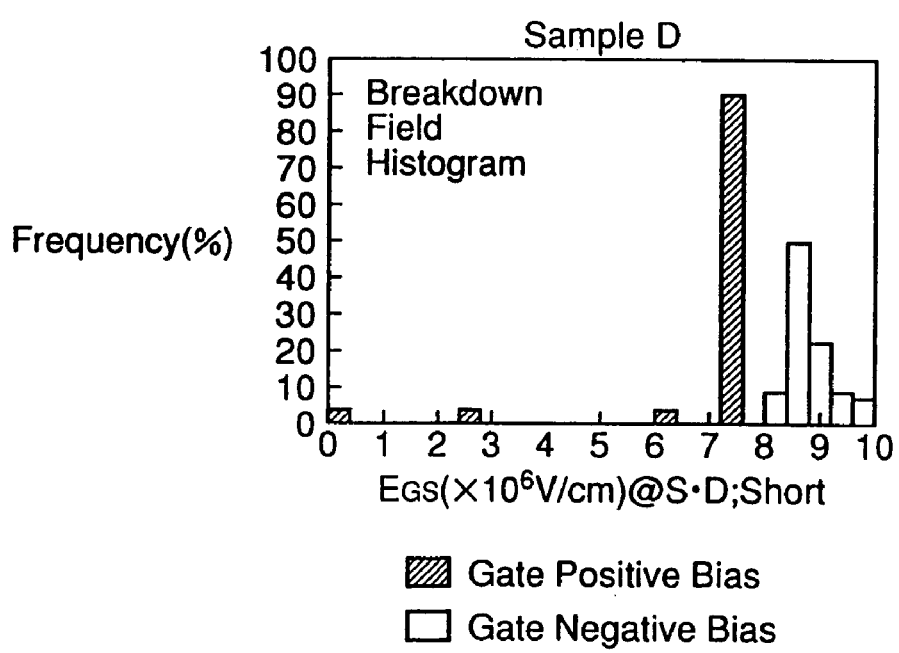

FIG. 21 illustrates how the leakage characteristics and the withstand voltage distribution of a gate insulation film in an n channel MOSFET depend on a gate bias. In FIG. 21, the vertical and horizontal axes denote the density of leakage current caused in the insulation film and the strength of an electric field applied to the gate electrode, respectively.

In FIG. 21, relations between the current density and the electric field strength when a positive bias (Gate Positive) is applied to the gate electrode are denoted by solid lines. In FIG. 21, relations between the density of current which flows in the gate insulation film and the strength of an electric field applied to the gate insulation film when a negative bias (Gate Negative) is applied to the gate electrode are denoted by dash lines.

As shown in FIG. 21, samples B, C, and D which include a stacked gate insulation film in this embodiment are improved in terms of the leakage characteristics of the gate insulation film as compared with sample A which includes a single layer gate insulation film formed of a thermal oxide film described in the conventional art. Especially in sample D, by placing the silicon nitride film nearer to the gate electrode than the surface of the silicon substrate, the leakage characteristics of the gate insulation film when a negative bias is applied to the gate electrode is extremely improved as compared with other samples. Since the evaluation results of the semiconductor device of sample C are almost the same as those of sample B, these are not shown in the figure.

FIGS. 22 to 25 illustrate relations between the frequency of gate insulation film breakdown occurrence and the strength of an electric field applied to the gate electrode. In FIGS. 22 to 25, the vertical and horizontal axes denote the frequency of gate insulation film breakdown occurrence and the strength of an electric field applied to the gate electrode, respectively.

As shown in FIGS. 22 to 25, samples B, C, and D which include the stacked gate insulation film in this embodiment are improved in terms of the withstand voltage distribution of the gate insulation film as compared with sample A which includes the single layer gate insulation film of a thermal oxide film described in the conventional art. It can be seen that the peak value of the frequency of gate insulation film breakdown occurrence is shifted toward the high electric field strength side.

Figure 26:
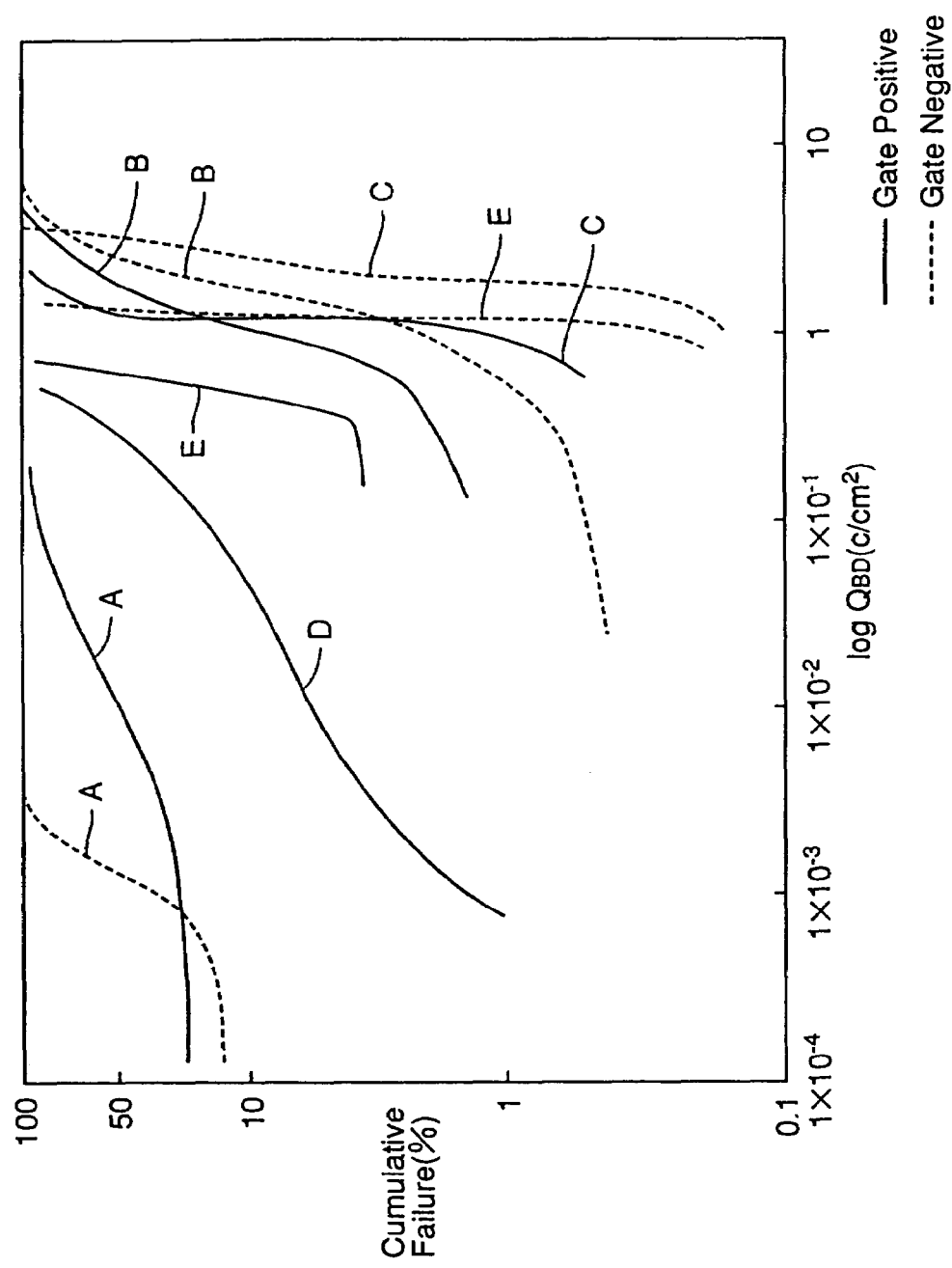
FIG. 26 illustrates the result of evaluating how the constant current TDDB (Time Dependent Dielectric Breakdown) characteristics of the MOS capacitor which has an MOS structure formed in a trench depend on a gate bias in the first embodiment of the present invention.

FIG. 26 illustrates how the constant current TDDB characteristics in an n channel MOSFET depend on a gate electrode bias. In FIG. 26, the vertical and horizontal axes denote the cumulative failure and the logarithm of $Q_{BD}$, respectively.

Figure 27:
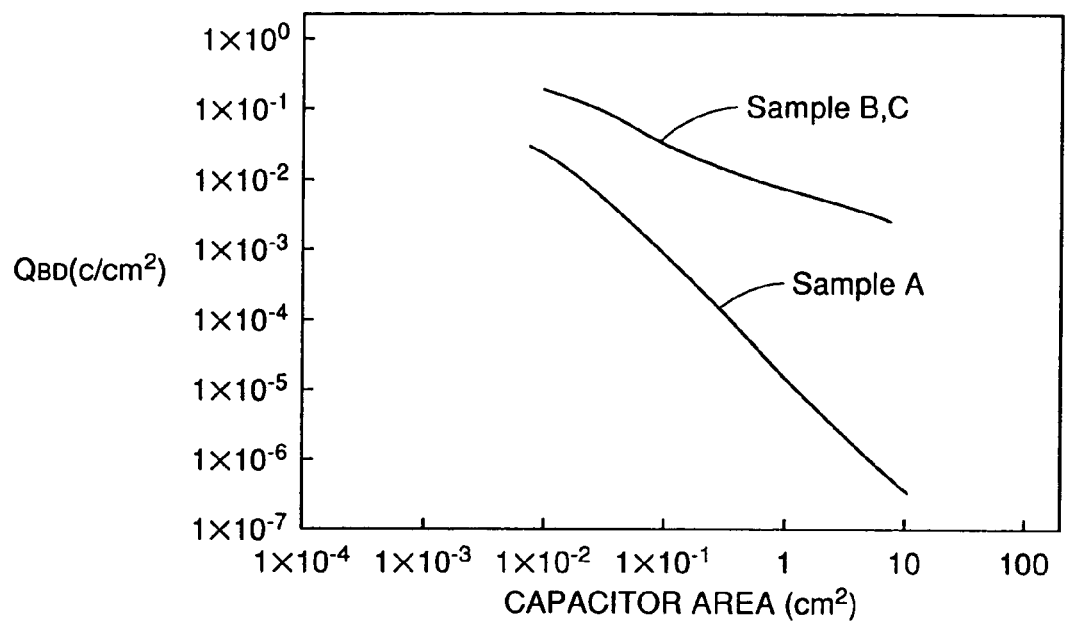
FIG. 27 illustrates the result of evaluating how the $Q_{BD}$ (Charge-to-Breakdown) value at 50% cumulative failure of the MOS capacitor which has an MOS structure formed in a trench depends on a capacitor area in the first embodiment of the present invention.

In FIG. 26, relations between the cumulative failure and the logarithm of $Q_{BD}$ when a positive bias (Gate Positive) is applied to the gate electrode are denoted by solid lines, and relations between the cumulative failure and the logarithm of $Q_{BD}$ when a negative bias (Gate Negative) is applied to the gate electrode are denoted by dash lines. In FIG. 27, the vertical and horizontal axes denote the logarithm of $Q_{BD}$ at 50% cumulative failure and the capacitor area, respectively.

As illustrated in FIG. 26, sample A which has the gate insulation film formed of a single layer thermal oxide film described in the conventional art suffers from a larger number of initial failures and has a lower $Q_{BD}$ value than other samples. It can be seen that samples B, C, and D in this embodiment are improved in terms of gate insulation reliability as compared with sample A.

FIG. 27 illustrates how the $Q_{BD}$(Charge-to-Breakdown) value at 50% cumulative failure depends on a capacitor area. As illustrated in FIG. 27, the $Q_{BD}$ values of samples B and C in the present invention are less dependent on the capacitor area than the $Q_{BD}$ value of sample A which includes the gate insulation film formed of a single layer thermal oxide film described in the conventional art. It can be seen that samples B and C are highly effective in obtaining the reliability of a larger area gate insulation film.

Figure 28:
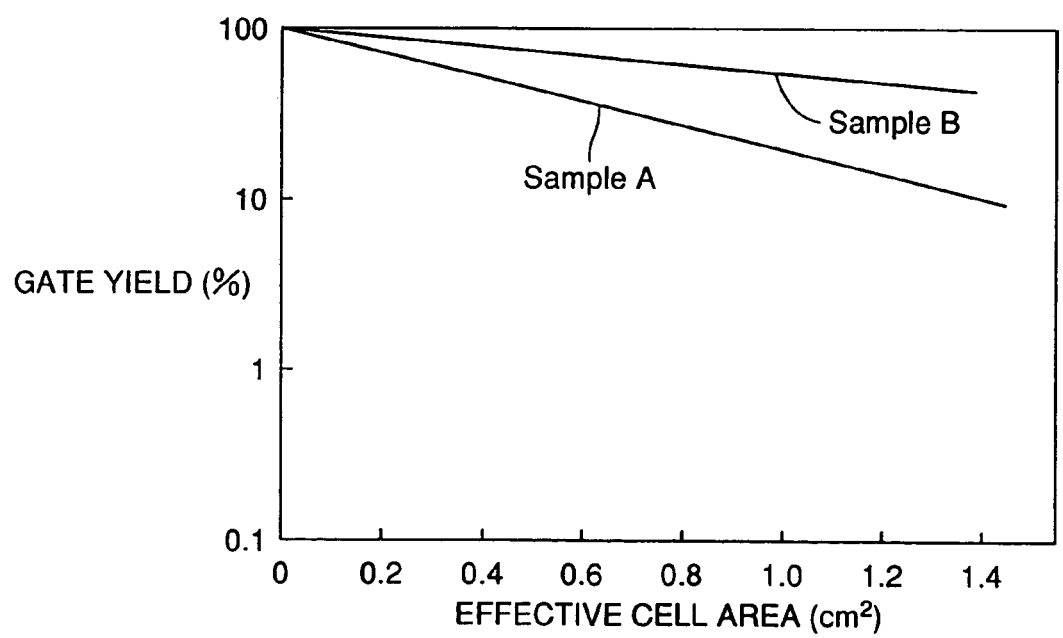
FIG. 28 illustrates the result of evaluating how the gate yield of the trench MOS gate IGBT in the first embodiment of the present invention depends on a cell area.

FIG. 28 illustrates how the yield of the stacked gate insulation film of samples A and B depends on an effective cell area (capacitor area). It is noted that the effective cell area is the area of a device which operates as an MOS transistor among the chip area.

As can be seen from FIG. 28, sample B which includes the stacked gate insulation film in this embodiment can better prevent lowering of the gate insulation film yield even if the effective cell area increases, as compared with sample A which includes the gate insulation film formed of a single layer thermal oxide film described in the conventional art. It can be seen as a result that sample B in this embodiment is superior even in the gate insulation film yield.

Figure 29:
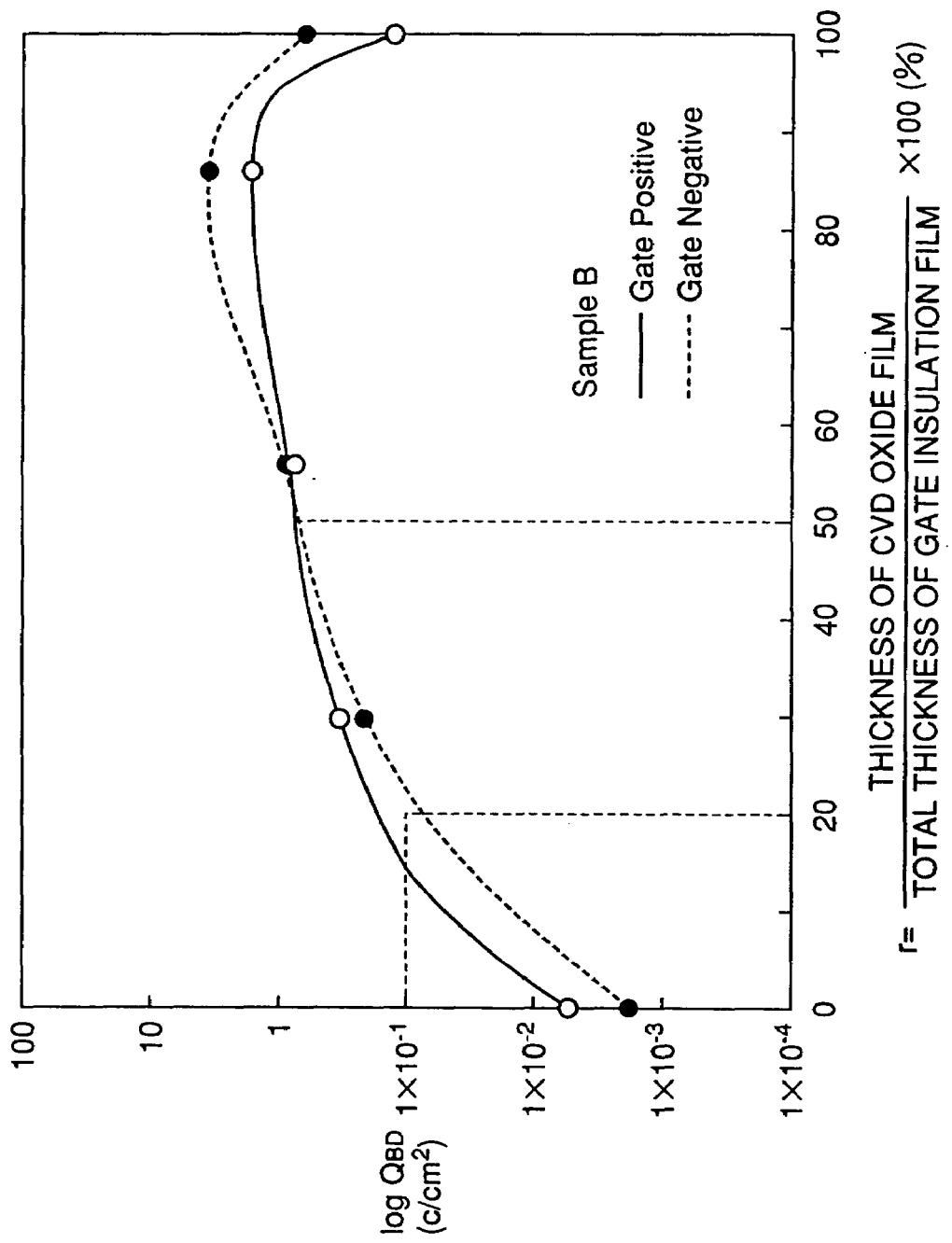
FIG. 29 illustrates relations between the logarithm of the $Q_{BD}$ value at 50% cumulative failure and the ratio r of the thickness of the CVD oxide film to that of the entire stacked gate insulation film in the MOS capacitor which has an MOS stuck formed in a trench in the first embodiment of the present invention.
Figure 30:
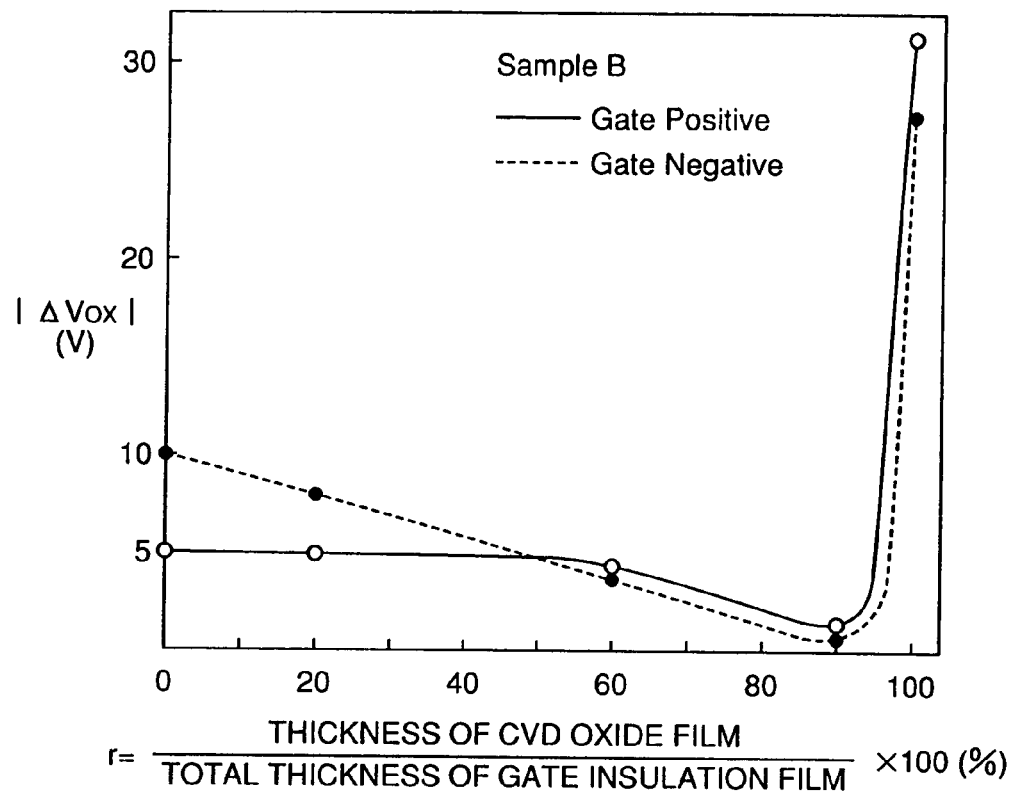
FIGS. 30 and 31 illustrate relations between $|\Delta V_{OX}|$ value and the ratio r of the thickness of the CVD oxide film to that of the gate insulation film in the first embodiment of the present invention.

FIG. 29 illustrates relations between the $Q_{BD}$ value at 50% cumulative failure obtained from the constant current TDDB characteristics and the ratio r of the thickness of the CVD oxide film to that of the stacked gate insulation film [r=(the thickness of the CVD oxide film/the thickness of the total gate insulation film)×100]. FIG. 30 illustrates relations between the average value of $|\Delta V_{OX}|$ obtained from the constant current TDDB characteristics and the ratio r.

Figure 31:
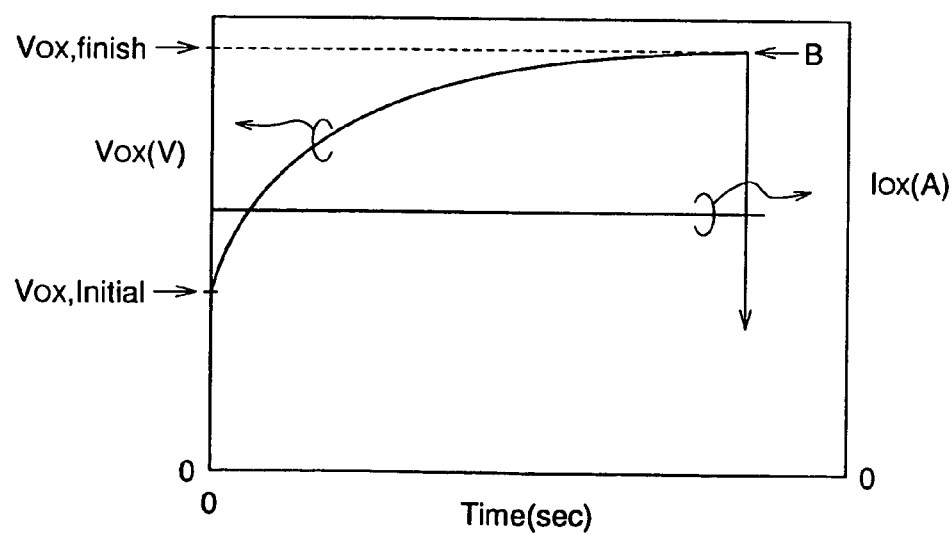

In FIGS. 29 and 30, the left end of the horizontal axis (r=0) indicates a case where the gate insulation film is formed of a single layer thermal oxide film, and the right end of the horizontal axis (r=100) indicates a case where the gate insulation film is formed of a single layer CVD oxide film. Further, $|\Delta V_{OX}|$ is obtained by the following expression as shown in FIG. 31.

$$|\Delta V_{OX}| = |V_{OX, Finish} - V_{OX, Initial}|$$

It can be seen from FIGS. 29 and 30, when the ratio r of the thickness of the CVD oxide film to that of the stacked gate insulation film is at least about 20%, the logarithm of the $Q_{BD}$ value is at least $1 \times 10^{-1}$ C/cm² and the $|V_{OX}|$ value is at most about 5V, and therefore the gate insulation film characteristics are improved.

If the logarithm of the $Q_{BD}$ value when the r value is about 20% is $1 \times 10^{-1}$ C/cm², the gate insulation film is at a usable level. If the logarithm of the $Q_{BD}$ value when the r value is at least about 50% is at least 1 C/cm², the gate insulation film is under ideal conditions. It can be seen from the results that the ratio of thickness of the CVD oxide film to that of the entire stacked gate insulation film is desirable when it is at least 20%, and more desirable when it is at least 50%.

Figure 32:
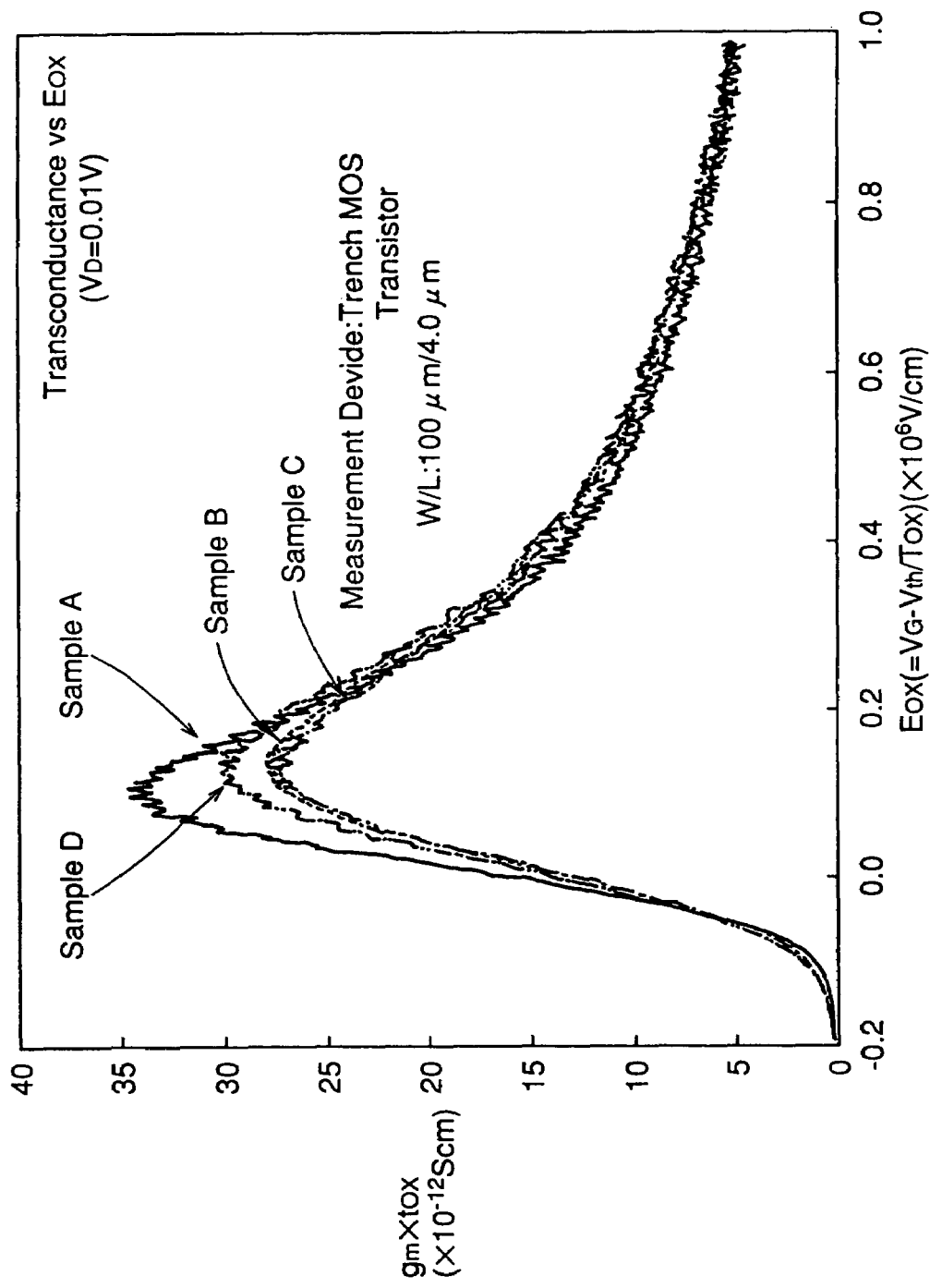
FIG. 32 illustrates the result of evaluating how the transistor characteristics of the MOS transistor which has an MOS structure formed in a trench depend on gate insulation film conditions in the first embodiment of the present invention.
Figure 33:
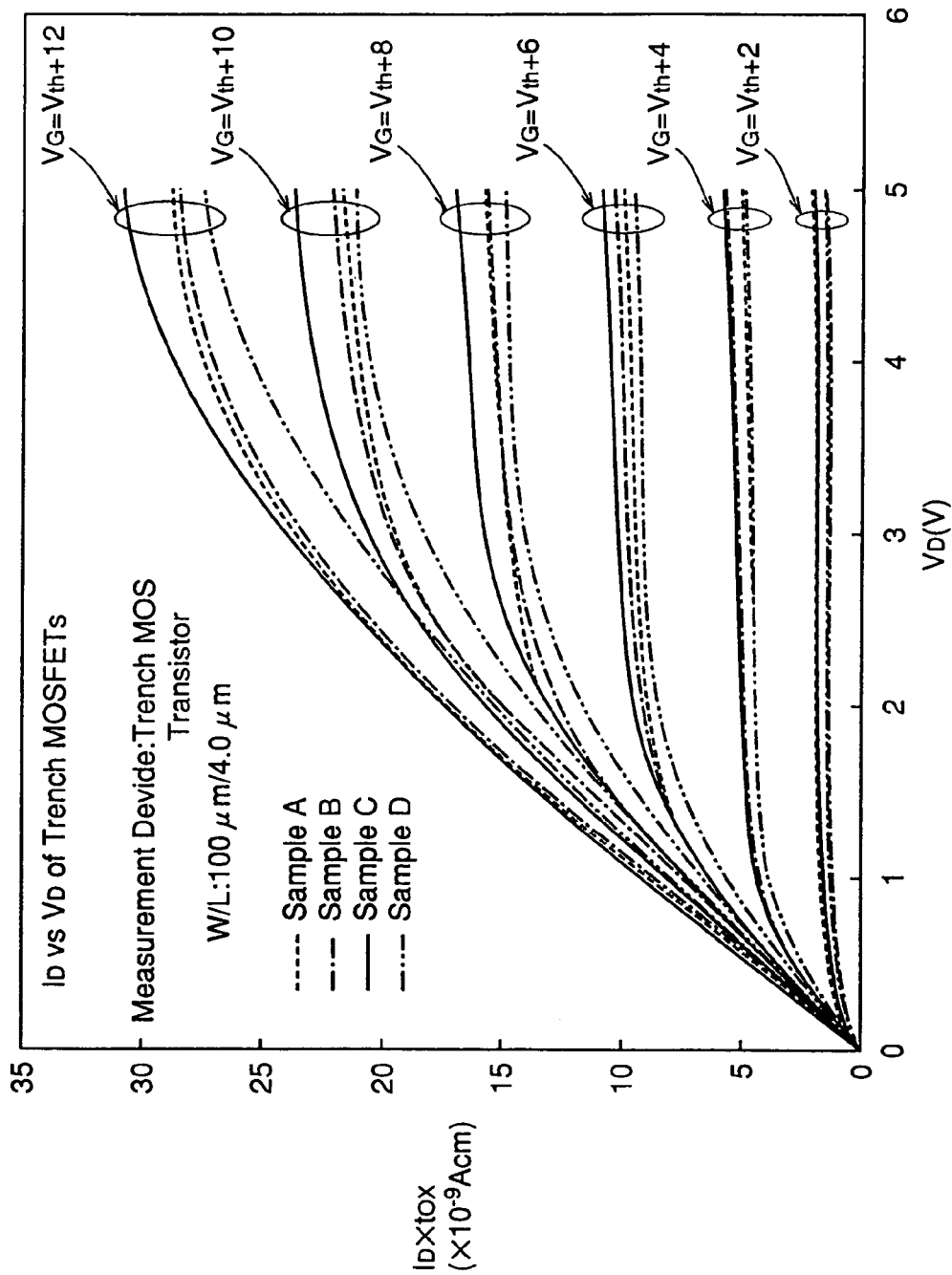
FIG. 33 illustrates the result of evaluating how the MOS transistor characteristics depend on gate insulation film conditions in the first embodiment of the present invention.
Figure 34:
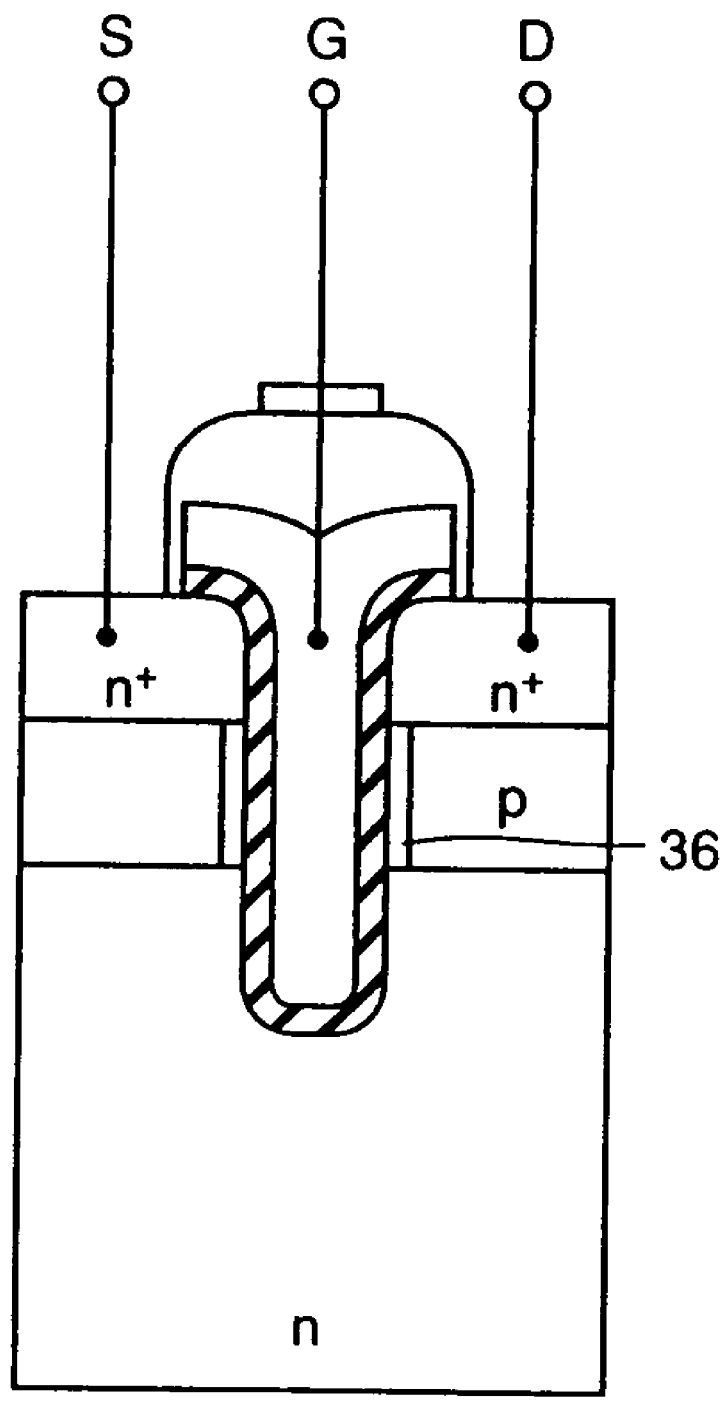
FIG. 34 is a sectional view showing an MOS transistor with an MOS structure formed in a trench, which is used for evaluating the MOS transistor characteristics, in the first embodiment of the present invention.

FIGS. 32 and 33 illustrate how the transistor characteristics of the MOS transistor which includes an MOS structure formed in a trench depend on gate insulation film conditions. FIG. 32 illustrates relations between the transconductance $g_m$ of electric charges which move in a channel region and the voltage $E_{ox}$ which is applied to the gate insulation film. FIG. 33 illustrates relations between the drain current $I_D$ and the drain voltage $V_D$. The evaluated device structure of a transistor which includes an MOS structure formed in a trench is an n channel type MOS transistor as shown in FIG. 34. A channel region 36 is shown in FIG. 34.

It can be seen from FIG. 32 that the MOS transistors of samples B, C, and E which include the gate insulation film formed of the stacked gate insulation film in this embodiment have the improved transconductance $g_m$ in a region where the voltage $E_{ox}$ applied to the gate insulation film is high, that is, a high electric field region, as compared with sample A which includes the gate insulation film formed of a single layer thermal oxide film. It can also be seen from FIG. 33 that the MOS transistor of sample C has a larger drain current $I_D$ for the same drain voltage $V_D$ than sample A in the high electric field region, and therefore the drivability of an MOS transistor is higher in sample C.

The transconductance $g_m$ of electric charges which move in channel regions of samples B, C, and E which include the stacked gate insulation film in this embodiment is improved in the high electric field region because the surface scattering of carriers which is caused by the trench surface roughness formed by thermal oxidation, that is, roughness caused by silicon at the trench sidewall surface that is to be a channel region is reduced by making the thickness of the thermal oxide film smaller.

It can be seen from the above described evaluation results that the MOS capacitor or MOS transistor which includes an MOS structure formed in a trench in this embodiment is improved in terms of gate insulation characteristics and reliability as compared with the conventional MOS structure in a trench formed by using only a thermal oxide film or a CVD oxide film as a gate insulation film. As a result, the MOS transistor characteristics are improved.

Figure 35:
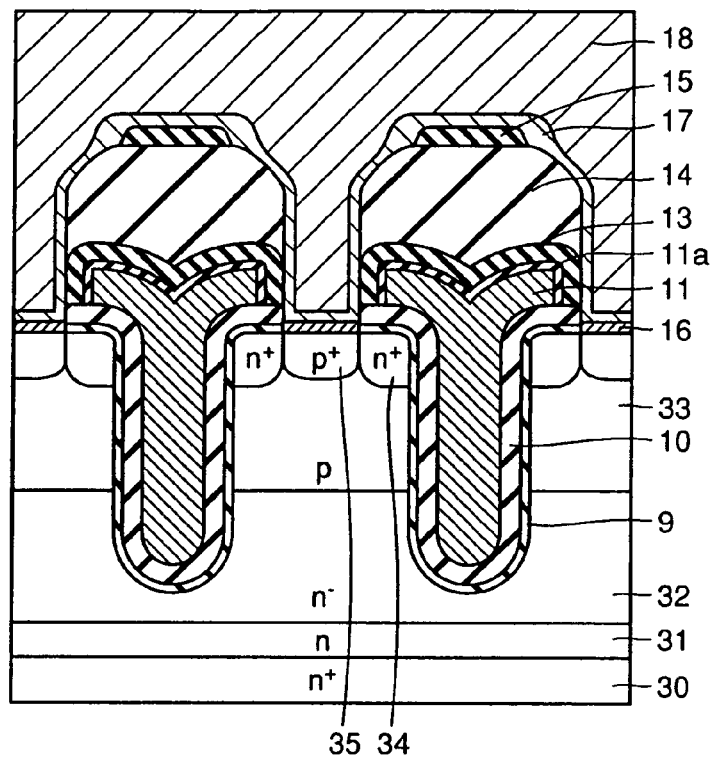
FIG. 35 is a sectional view showing another example of the IGBT which has an MOS structure formed in a trench in the first embodiment of the present invention.
Figure 36:
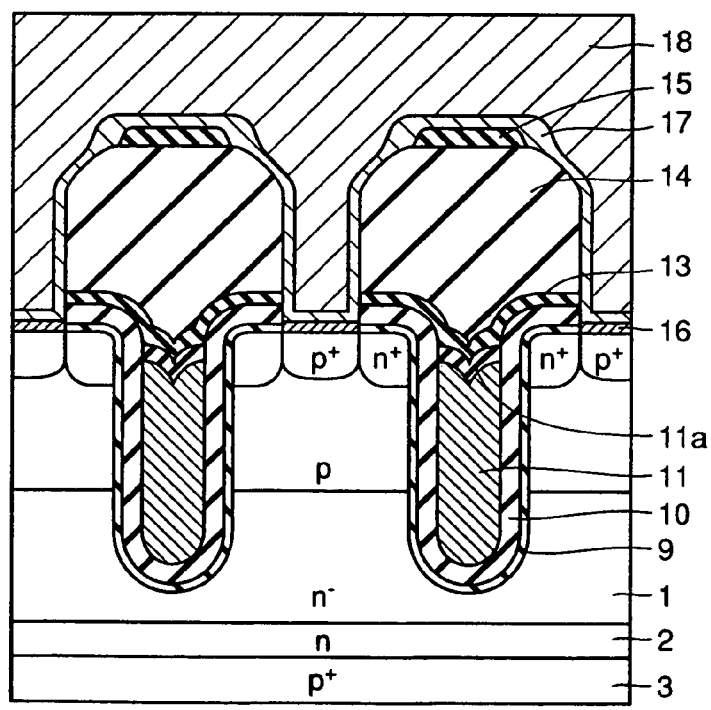
FIG. 36 is a sectional view showing another example of the IGBT which has an MOS structure formed in a trench in the first embodiment of the present invention.

In the IGBT of the present invention, similar effects to those of the IGBT in this embodiment can be attained in any of the cases where the surface of a gate electrode which fills a trench protrudes from the surface of the semiconductor substrate as shown in FIG. 35 and where the surface is in the trench and does not protrude from the semiconductor substrate surface as shown in FIG. 36.

As shown in FIG. 36, the IGBT of another example is different from the IGBT shown in FIG. 1 in that it includes an n⁺-type impurity diffusion layer 30, an n-type impurity diffusion layer 31, an n⁻-type impurity diffusion layer 32, a p-type impurity diffusion layer 33, an n⁺-type impurity diffusion layer 34, and a p⁺-type impurity diffusion layer 35.

The IGBT having the structure shown in FIG. 36 can also attain similar effects to those of the IGBT which includes an MOS structure formed in a trench in this embodiment as shown in FIG. 1. Although the n channel MOSFET is shown in FIG. 36, similar effects can be obtained even by replacing the n channel type MOSFET with a p channel type MOSFET.

Figure 37:
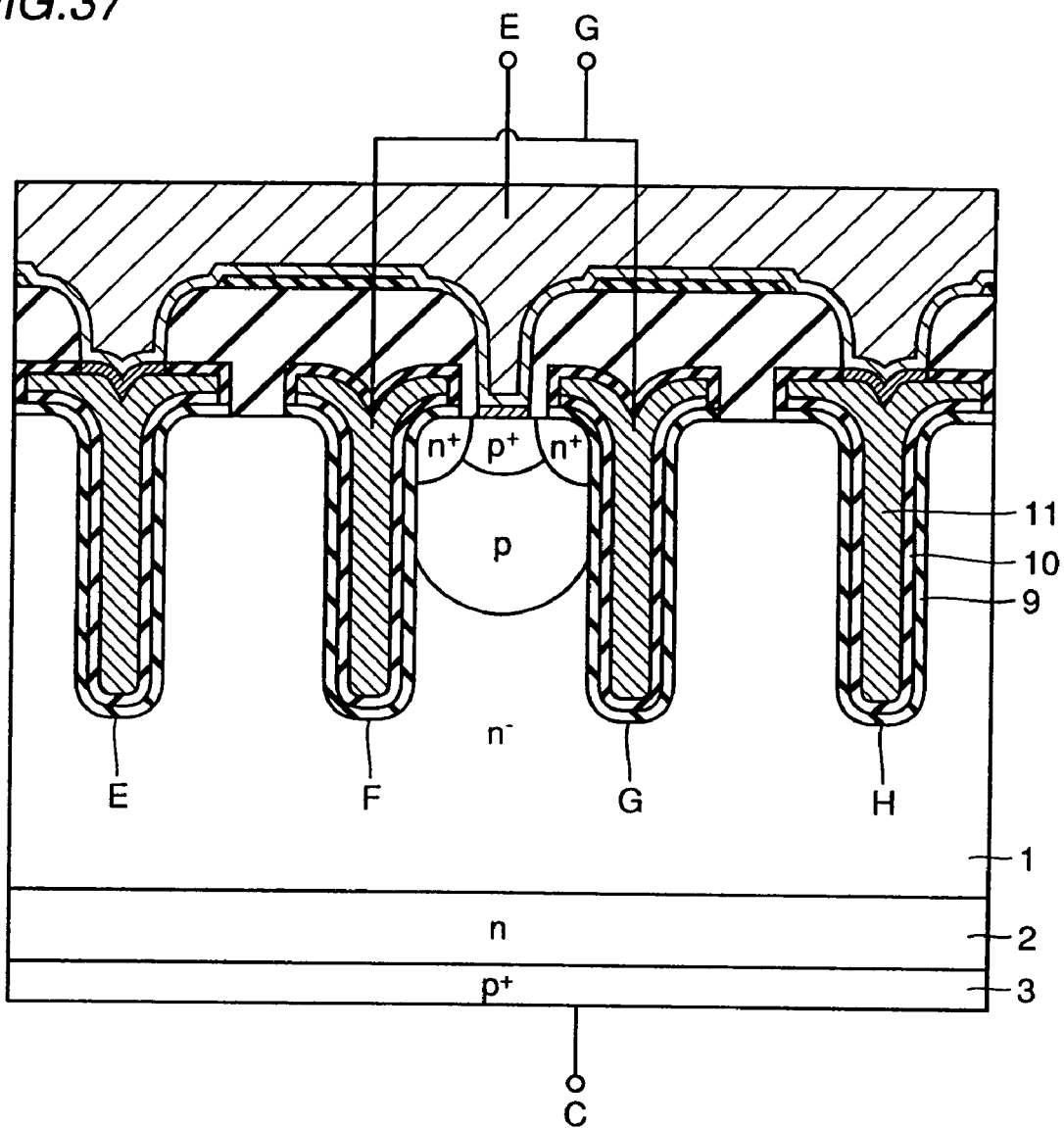
FIG. 37 is a sectional view showing another example of the IGBT which has an MOS structure formed in a trench in the first embodiment of the present invention.

Even if the above described structure of the stacked gate insulation film is applied to an IGBT in which one of a plurality of conductive layers formed in a plurality of trenches operates as the gate electrode of an MOS transistor as shown in FIG. 37, similar effects to those of the IGBT which includes an MOS structure formed in a trench in this embodiment shown in FIG. 1 can be obtained.

In FIG. 37, each of trenches F and G is provided with the MOS structure which operates as a gate electrode. Each of trenches E and H is provided with the MOS structure which does not operate as a gate electrode.

The stacked gate insulation film structure of the IGBT according to the present invention can be applied to an IGBT which includes a transistor with the trench MOS gate structure, the power device structure, and other MOS gate structures. In any IGBTs, similar effects to those of the IGBT structure in this embodiment shown in FIG. 1 can be obtained.

Second Embodiment

Figure 38:
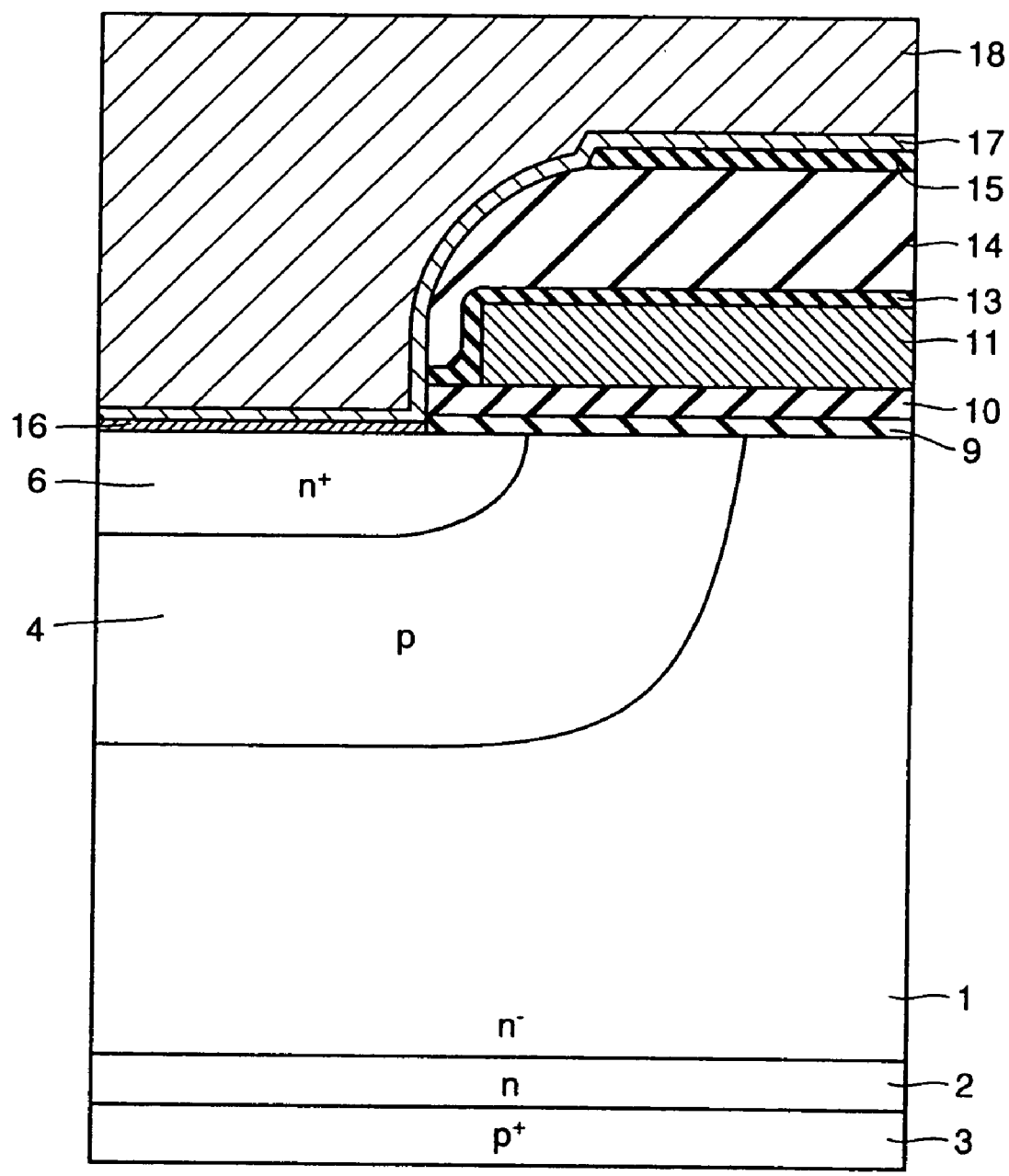
FIG. 38 is a sectional view showing an example of an IGBT which has a planar MOS structure formed on a semiconductor substrate surface in a second embodiment of the present invention.

As illustrated in FIG. 38, the semiconductor device structure which includes an IGBT with a planar MOS structure as one example of a second embodiment of the present invention includes impurity layers as described below formed in a semiconductor substrate 100. A $p^+$-type impurity diffusion layer 3 is formed as the lowest layer of semiconductor substrate 100. An n-type impurity diffusion layer 2 is formed on $p^+$-type impurity diffusion layer 3. An $n^-$type impurity diffusion layer 1 is formed on n-type impurity diffusion layer 2. A p-type base layer 4 is formed on $n^-$type impurity diffusion layer 1. An $n^+$-type emitter layer 6 is formed in p-type base layer 4.

On semiconductor substrate 100, a refractory metal silicide layer 16 is formed on the surface of $n^+$-type emitter layer 6. Further, a thermal oxide film 9 of a silicon oxide film is formed by oxidating part of the top surface of semiconductor substrate 100. To cover the top surface of thermal oxide film 9, a CVD oxide film 10 which is a silicon oxide film formed by CVD method is formed. A gate electrode 11 is formed on CVD oxide film 10. A CVD oxide film 13 is formed on the surface of gate electrode 11. Silicate glass 14 is formed on CVD oxide film 13.

A CVD oxide film 15 is formed at the top of silicate glass 14. A barrier metal layer 17 is formed to cover the surfaces of silicate glass 14, CVD oxide film 15, and refractory metal silicide layer 16. An aluminum interconnection layer 18 is formed to cover the surface of barrier metal layer 17. It is noted as an example that gate electrode 11 employs polycrystalline silicon which contains phosphorus of high concentration or a material which is prepared by ion-implanting phosphorus into polycrystalline silicon.

Similarly to the semiconductor device which has the trench MOS structure (which has an MOS structure formed in a trench) in the first embodiment, the IGBT which has the planar MOS structure in this embodiment includes a stacked gate insulation film which is formed of at least two types of insulation films, that is, a thermal oxide film 9 provided on semiconductor substrate 100 and a CVD oxide film 10 provided nearer to gate electrode 11 than thermal oxide film 9. Similarly to the IGBT which has the trench MOS structure in the first embodiment, the IGBT in this embodiment is characterized in that the ratio of the thickness of CVD oxide film 10 to that of the entire stacked insulation film is at least 20%.

The stacked gate insulation film of the semiconductor device which includes the planar MOS structure as one example of this embodiment has nitrogen which is segregated near an interface between thermal oxide film 9 and semiconductor substrate 100 and an interface between gate electrode 11 and CVD oxide film 10.

Figure 39:
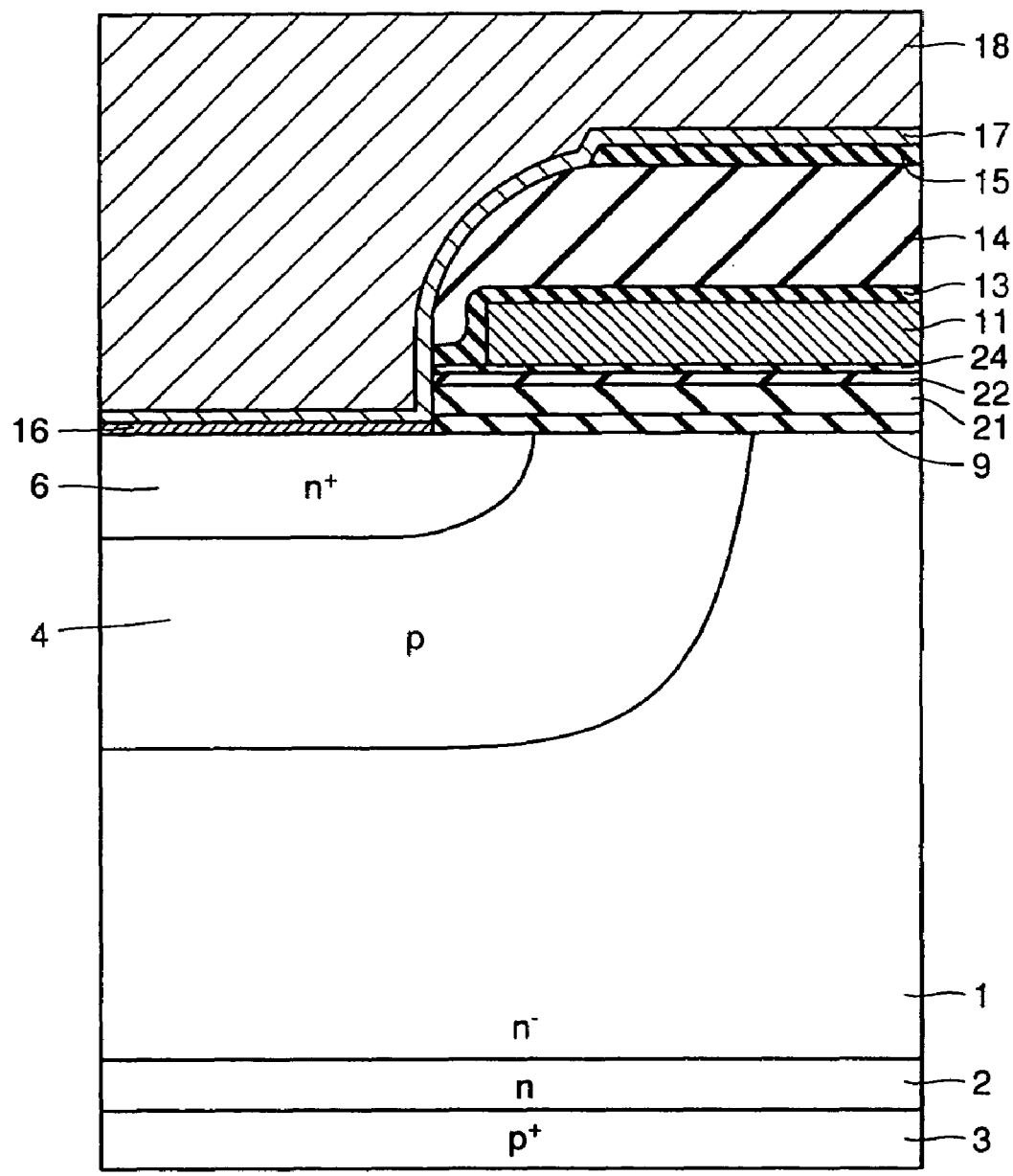
FIG. 39 is a sectional view showing another example of the IGBT which has a planar MOS structure formed on a semiconductor substrate surface in the second embodiment of the present invention.

A semiconductor device which includes an IGBT having the planar MOS structure as another example of this embodiment has the following stacked insulation film structure as shown in FIG. 39. A silicon nitride film 21 is formed on semiconductor substrate 100, an oxide film 22 is formed on silicon nitride film 21 by thermal oxidation, and a CVD oxide film 24 is formed on oxynitride film 22. In other words, the stacked gate insulation film is formed of thermal oxide film 9, silicon nitride film 21, oxide film 22, and CVD oxide film 24. Here, CVD oxide film 24 may not be formed.

The stacked gate insulation film of the semiconductor device which includes the IGBT having the planar MOS structure as another example of this embodiment also has nitrogen which is segregated near an interface between thermal oxide film 9 and semiconductor substrate 100 and an interface between gate electrode 11 and CVD oxide film 24.

Figure 40:
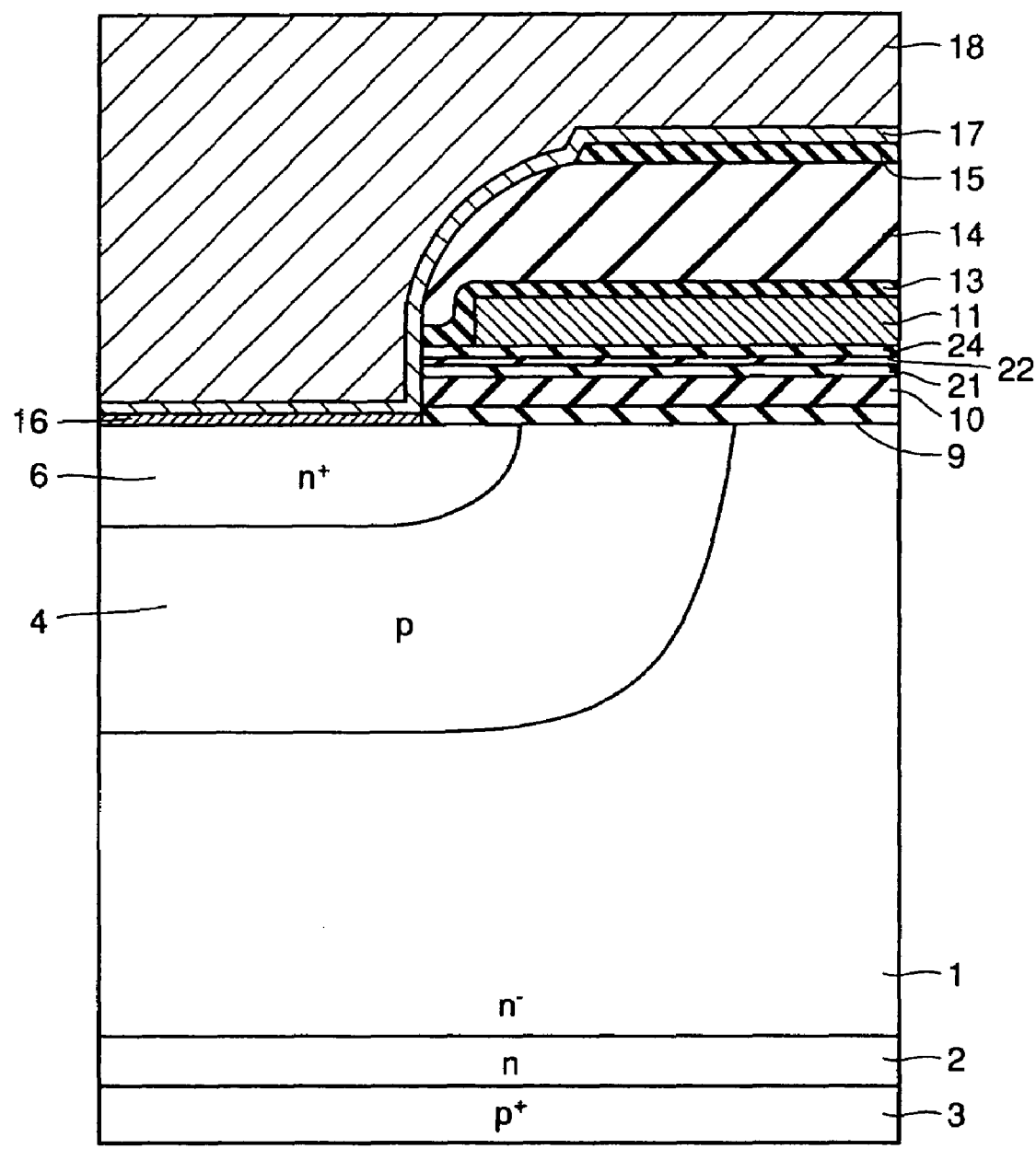
FIG. 40 is a sectional view showing still another example of the IGBT which has a planar MOS structure formed on a semiconductor substrate surface in the second embodiment of the present invention.
Figure 41:
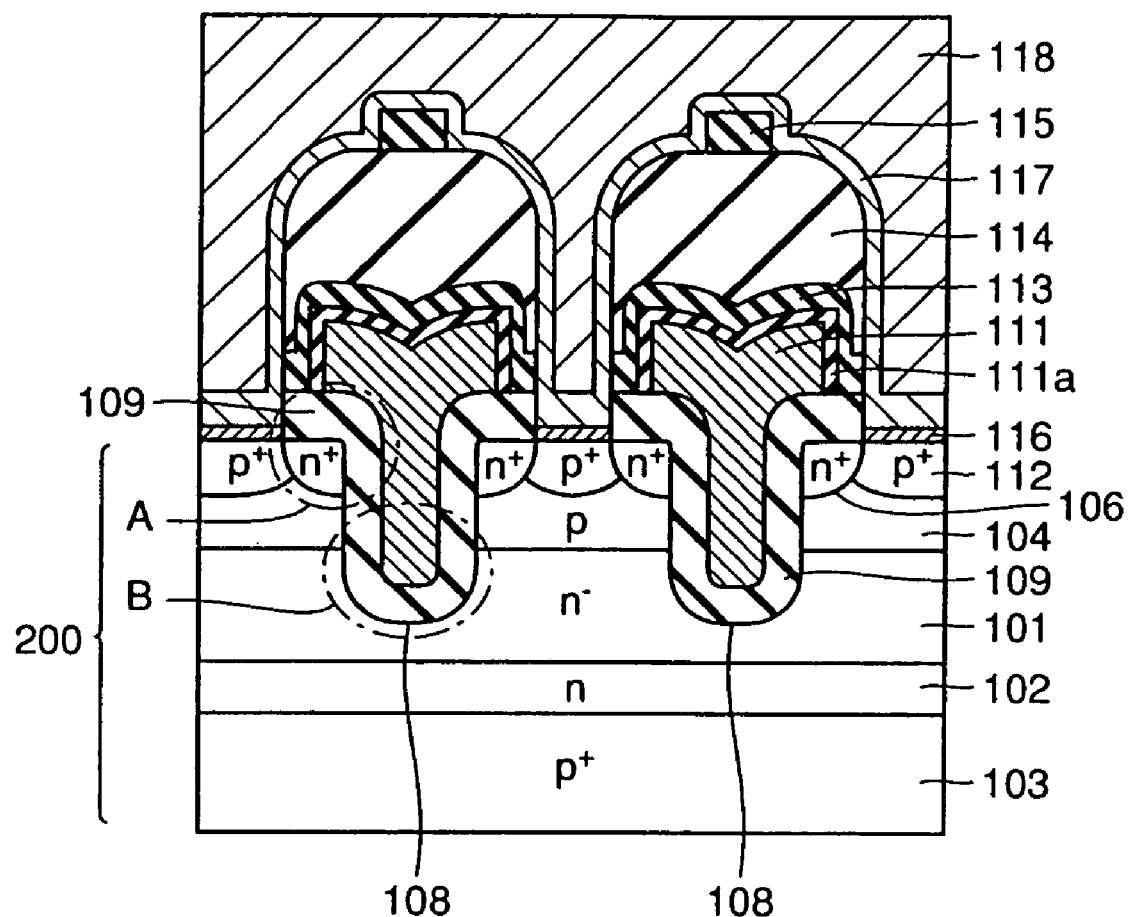
FIG. 41 is a sectional view showing a conventional IGBT which has an MOS structure formed in a trench.

A semiconductor device having the planar MOS structure as still another example of this embodiment has the following stacked gate insulation film structure as shown in FIG. 40. Thermal oxide film 9 is formed on semiconductor substrate 100, CVD oxide film 10 is formed on thermal oxide film 9, silicon nitride film 21 is formed on CVD oxide film 10, oxide film 22 is formed on silicon nitride film 21 by thermal oxidation, and CVD oxide film 24 is formed on oxide film 22. In other words, the stacked gate insulation film is formed of thermal oxide film 9, CVD oxide film 10, silicon nitride film 21, oxide film 22, and CVD oxide film 24. Here, CVD oxide film 24 may not be formed.

The semiconductor device which includes the IGBT having the planar MOS structure as still another example of this embodiment also has nitrogen, in the stacked gate insulation film, which is segregated near an interface between thermal oxide film 9 and semiconductor substrate 100 and an interface between gate electrode 11 and CVD oxide film 24.

According to the semiconductor devices which include the planar MOS structures as one, another, and still another examples of this embodiment, the uniformity of the stacked gate insulation film thickness is maintained well and the occurrence of interface states is prevented at the interface between thermal oxide film 9 and semiconductor substrate 100 and the interface between gate electrode 11 and CVD oxide films 10, 24 similarly to the semiconductor device which includes the trench MOS structure in the first embodiment. Similarly to the semiconductor device having the trench MOS gate structure, therefore, the semiconductor device having the planar MOS gate structure can attain improved transistor characteristics by using the above described stacked gate insulation film structure.

The manufacturing process of the stacked gate insulation film in this embodiment is performed similarly to the manufacturing process of the semiconductor device which includes the IGBT having the trench MOS structure as described with reference to (1) to (4).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a field effect type semiconductor device having a stacked gate insulation film and a gate electrode on a semiconductor layer, comprising:
    a step of forming said stacked gate insulation film including the steps of
        forming a thermal oxide film on the semiconductor layer by thermal oxidation, and
        forming a CVD oxide film on said thermal oxide film by a CVD method, said stacked gate insulation film having nitrogen segregated at an interface region between at least one of said thermal oxide film and said semiconductor layer, and said gate electrode and said CVD oxide film, wherein
a concentration of nitrogen along an entire length of the stacked gate insulation film, excluding the vicinity of both interface regions, is higher than the average concentration of nitrogen in the semiconductor layer or the gate electrode, and
a ratio of a thickness of said CVD oxide film to that of an entire stacked gate insulation film is at least 20%.

2. The method of manufacturing a semiconductor device according to claim 1, wherein
said CVD oxide film is formed in the step of forming said CVD oxide film so that the ratio of the thickness of the CVD oxide film to that of said entire stacked gate insulation film is at least 50%.

3. The method of manufacturing a semiconductor device according to claim 1, wherein
said step of forming said stacked gate insulation film includes the step of forming said thermal oxide film and then nitriding said thermal oxide film to segregate nitrogen near an interface between said thermal oxide film and said semiconductor layer.

4. The method of manufacturing a semiconductor device according to claim 1, wherein
said semiconductor layer is constituted by a semiconductor substrate provided a trench therein, and
said thermal oxide film is formed along a surface of the trench in the step of forming said thermal oxide film.

5. The A method of manufacturing a field effect type semiconductor device having a stacked gate insulation film and a gate electrode on a semiconductor layer, comprising:
a step of forming said stacked gate insulation film including the steps of
forming a thermal oxide film on the semiconductor layer by thermal oxidation, and
forming a CVD oxide film on said thermal oxide film by a CVD method,
said stacked gate insulation film having nitrogen segregated at an interface region between at least one of said thermal oxide film and said semiconductor layer, and said gate electrode and said CVD oxide film, wherein
a concentration of nitrogen along an entire length of the stacked gate insulation film, excluding the vicinity of both interface regions, is higher than the average concentration of nitrogen in the semiconductor layer or the gate electrode, and
said step of forming said stacked gate insulation film includes the step of forming said CVD oxide film and then nitriding said CVD oxide film to segregate nitrogen near an interface between said thermal oxide film and said semiconductor layer and an interface between said gate electrode and said CVD oxide film.

6. A method of manufacturing a field effect type semiconductor device having a stacked gate insulation film and a gate electrode on a semiconductor layer, comprising:
a step of forming said stacked gate insulation film including the steps of
forming a thermal oxide film on the semiconductor layer by thermal oxidation, and
forming a CVD oxide film on said thermal oxide film by a CVD method,
said stacked gate insulation film having nitrogen segregated at an interface region between at least one of said thermal oxide film and said semiconductor layer, and said gate electrode and said CVD oxide film, wherein
a concentration of nitrogen along an entire length of the stacked gate insulation film, excluding the vicinity of both interface regions, is higher than the average concentration of nitrogen in the semiconductor layer or the gate electrode, and
said step of forming said stacked gate insulation film includes the step of forming, after forming said CVD oxide film, a silicon nitride film on said CVD oxide film.

7. The method of manufacturing a semiconductor device according to claim 6, wherein
said step of forming said stacked gate insulation film further includes the step of forming, after forming said silicon nitride film, an oxide film by oxidating a surface of said silicon nitride film.

8. The method of manufacturing a semiconductor device according to claim 7, wherein
said step of forming said stacked gate insulation film includes the step of forming, after forming said thermal oxide film, a silicon nitride film on said thermal oxide film, or forming, after said step of oxidating the surface of said silicon nitride film, another CVD oxide film on said oxide film.

9. A method of manufacturing a field effect type semiconductor device having a stacked gate insulation film and a gate electrode on a semiconductor layer, comprising:
a step of forming said stacked gate insulation film including the steps of
forming a thermal oxide film on the semiconductor layer by thermal oxidation, and
forming a CVD oxide film on said thermal oxide film by a CVD method,
forming a silicon nitride film on at least one of said thermal oxide film or said CVD oxide film, and
oxidating the surface of said silicon nitride film, wherein
said silicon nitride film is formed on said CVD oxide film, and
subsequent to oxidating the surface of said silicon nitride film, forming another CVD oxide film on the silicon nitride film.

* * * * *